United States Patent
Schmaelzle et al.

(10) Patent No.: US 8,223,433 B2
(45) Date of Patent: Jul. 17, 2012

(54) STATIONARY SUNLIGHT REDIRECTING ELEMENT AND SYSTEM

(75) Inventors: Philipp H. Schmaelzle, Los Altos, CA (US); Matthew D. Eisaman, Redwood City, CA (US); Patrick Y. Maeda, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 23 days.

(21) Appl. No.: 12/853,258

(22) Filed: Aug. 9, 2010

(65) Prior Publication Data

US 2012/0033301 A1    Feb. 9, 2012

(51) Int. Cl.
*G02B 17/00* (2006.01)
*G02B 27/00* (2006.01)

(52) U.S. Cl. ........................................ 359/593; 359/597

(58) Field of Classification Search .......... 359/591–593, 359/595–597
See application file for complete search history.

(56) References Cited

U.S. PATENT DOCUMENTS

| | | | | |
|---|---|---|---|---|
| 354,540 A | * | 12/1886 | Schoenberg | 359/593 |
| 4,411,493 A | * | 10/1983 | Miller | 359/595 |
| 4,773,733 A | * | 9/1988 | Murphy et al. | 359/593 |
| 5,802,784 A | * | 9/1998 | Federmann | 52/204.5 |
| 2011/0120524 A1 | * | 5/2011 | Wares et al. | 136/246 |

FOREIGN PATENT DOCUMENTS

JP    61165702 A  *  7/1986

* cited by examiner

*Primary Examiner* — Christopher Mahoney
(74) *Attorney, Agent, or Firm* — Bever, Hoffman & Harms, LLP; Patrick T. Bever

(57) ABSTRACT

A low-cost sunlight redirecting element including multiple substantially identical redirecting structures uniformly arranged and fixedly disposed on a base, where each redirecting structure includes multiple optical surface regions that are cooperatively formed and arranged such that, when the sunlight redirecting element is operably fixedly oriented relative to a stationary target with sunlight directed along an incident direction onto the redirecting structures, at least some of the sunlight is transmitted between the corresponding optical surface regions of each redirecting structure, and redirected from the corresponding optical surface regions toward the target's surface. The optical surface regions are shaped and arranged to redirect the sunlight toward the fixed target surface even when the sunlight's incident angle direction changes during the course of a year. A stationary sunlight redirecting system (e.g., an architectural daylighting arrangement or PV farm) includes the sunlight redirecting element maintained in a fixed relationship to the stationary target surface.

20 Claims, 12 Drawing Sheets

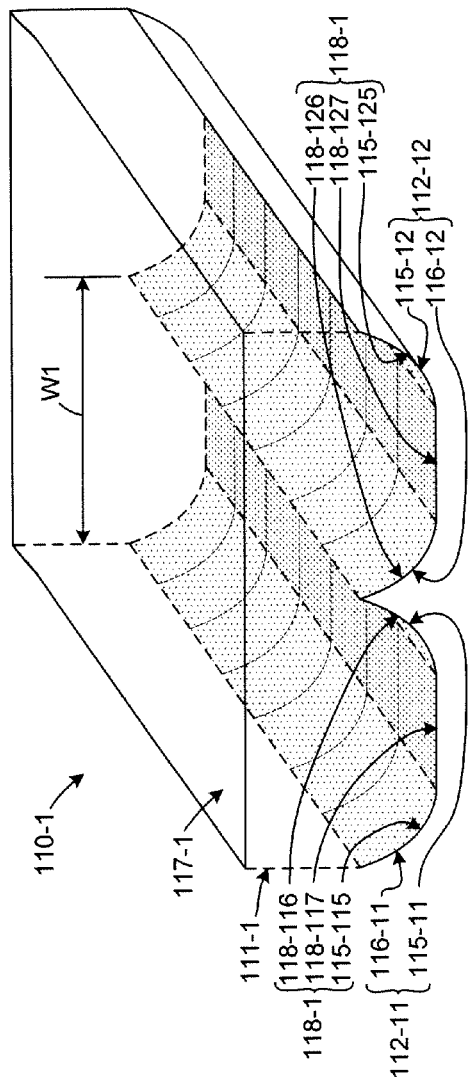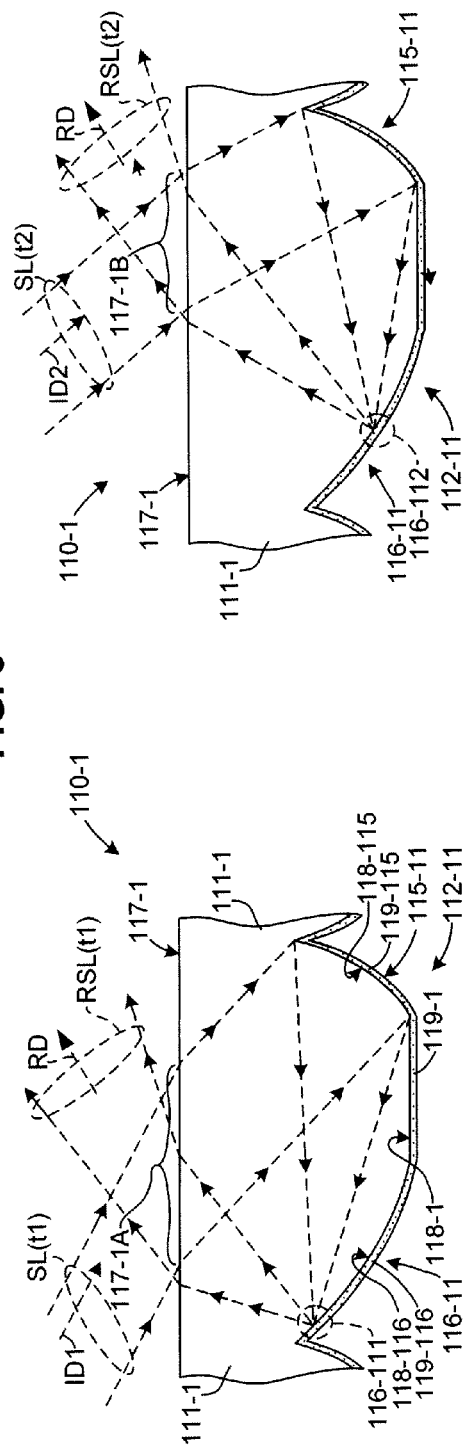

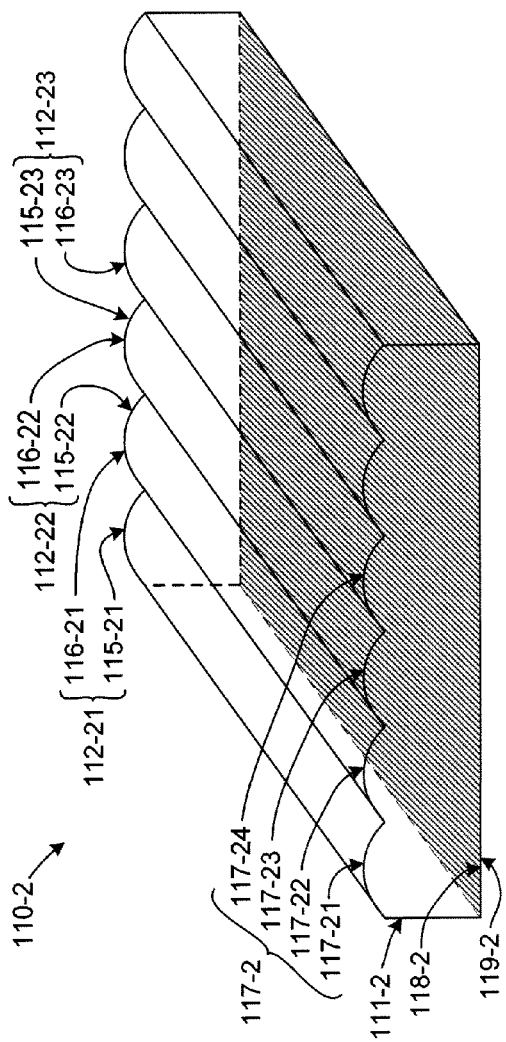
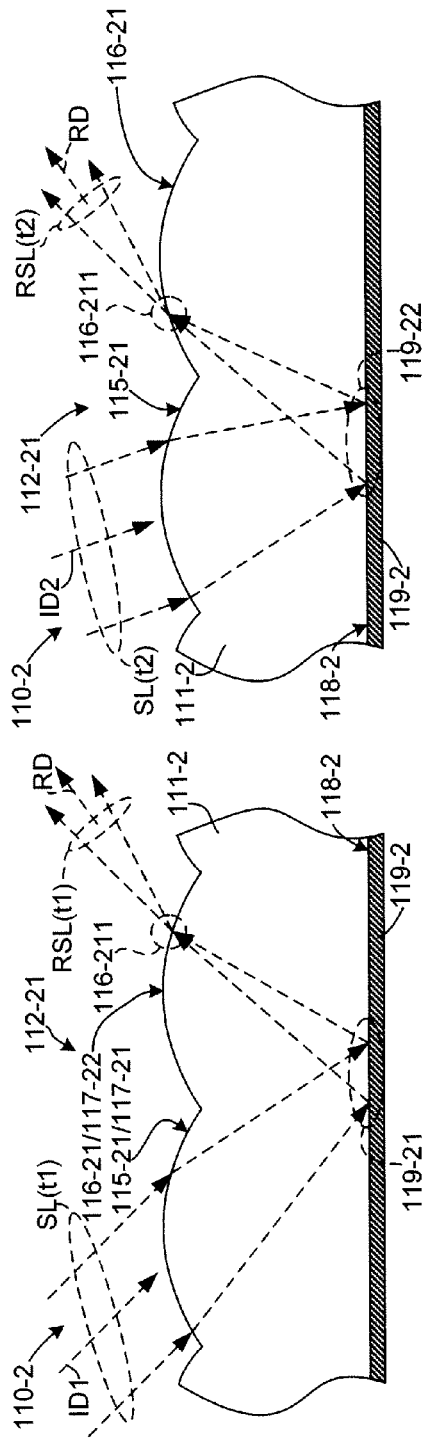
FIG. 5
FIG. 6(A)
FIG. 6(B)

US 8,223,433 B2

STATIONARY SUNLIGHT REDIRECTING ELEMENT AND SYSTEM

FIELD OF THE INVENTION

The present invention is directed to a low-cost sunlight redirecting systems in which sunlight is directed onto a target surface, and more particularly to low-cost sunlight redirecting elements that redirect sunlight received from a range of incident directions onto a fixed target surface in a substantially uniform pattern.

BACKGROUND OF THE INVENTION

Architectural daylighting is the practice of placing windows http://en.wikipedia.org/wiki/Window or other openings and reflective surfaces so that, during the day, natural sunlight provides effective internal lighting within a building structure. Particular attention is given to daylighting while designing a building when the aim is to maximize visual comfort or to reduce energy use, for example, from the reduced use of artificial (electric) lighting. In this way, sunlight is used to reduce our dependence on convention (e.g., oil, coal and gas) energy sources.

FIGS. 13(A) and 13(B) are simplified cross-sectional side views showing a portion of a building 20 having a room 21 fitted with a light shelf 22, which is an example of an architectural daylighting element that allows daylight to penetrate into a building. Light shelf 22 is a horizontal light-reflecting overhang that is placed above eye-level and has a high-reflectance upper surface 23. Upper surface 23 is then used to reflect sunlight SL through an upper window 24 onto a ceiling 25 as deep into room 21 as possible. Ceiling 25 is formed is preferably formed by a light-scattering material that redirects the light downward for use within the room. Light shelves 22 are typically used in high-rise and low-rise office buildings, and in particular are disposed on the equator-facing side of the building, which is where maximum sunlight is found. Architectural light shelves have been proven to reduce the amount of artificial lighting in a building by reflecting sunlight deep into each room, thereby facilitating the reduction or possible elimination of incandescent and fluorescent lighting, depending on depth of the room.

A problem with conventional light shelves is that the effective lighting within a room changes significantly over the course of a year. FIG. 13(A) illustrates winter sunlight SL(t1), which is directed by the sun at an incident direction ID1 that forms a relatively shallow angle relative to light shelf 22. Due to the shallow incident angle, winter sunlight SL(t1) is directed through eye-level windows 26 and is reflected by high-reflectance upper surface 23 at a corresponding angle deep into room 21, thereby producing suitable daylighting substantially throughout room 21 during the winter months when the sun remains low on the horizon. In contrast, FIG. 13(B) illustrates summer sunlight SL(t2), which is directed by the sun at an incident direction ID2 that forms a relatively steep angle relative to light shelf 22. Due to the steep incident angle, summer sunlight SL(t2) is reflected by high-reflectance upper surface 23 at a corresponding angle only a short distance into room 21, thereby producing suitable daylighting at a distance D2 inside room 21. This migration of effective daylighting during the year can become inconvenient and possibly irritating to the inhabitants of room 21, and can significantly increase the need for incandescent/fluorescent lighting in deep regions 27 of room 21 during the summer months.

In addition to the recent increased use of sunlight to provide natural lighting, there is a current trend toward the production of large solar power stations that directly convert sunlight to electricity that is fed into the existing electrical grid, further reducing our dependence on conventional energy sources. For example, PV farms are solar-to-electricity power stations that utilize large numbers of solar photovoltaic (PV) cells to convert sunlight into electricity on a commercial scale. Many such PV farms having power production in the range of 40 MW to 60 MW have already been built, mainly in Europe and the United States, and PV farms having capacities of up to 1 GW or more are being proposed. As the amount of power generated by such PV farms increases, it will become more and more desirable to utilize technologies that increase each PV farm's output by even a few percent.

FIGS. 14 and 15 illustrate portions of a typical fixed-tilt PV farm 50, which represents one PV farm type that is currently being used for commercial solar power generation. Fixed-tilt PV farms are characterized by having flat-panel solar PV cells that are maintained in a fixed position that is inclined (tilted) relative to the ground in order to maximize the capture of sunlight. FIG. 14 is a top perspective view showing three exemplary PV panel assemblies 60-1, 60-2 and 60-3, where each panel assembly 60-1, 60-2 and 60-3 includes an associated group of solar cell panels 65-11 to 65-16, 65-21 to 65-26 and 65-31 to 65-36 that are maintained in a desired "fixed-tilt" arrangement. Each of the solar cell panels 65-11 to 65-16, 65-21 to 65-26 and 65-31 to 65-36 includes multiple flat panel solar cells 80 that are maintained in a flat (planar) arrangement by a suitable panel structure (e.g., a plate of glass to which solar cells 80 are attached). Panel assemblies 60-1, 60-2 and 60-3 are spaced at a predetermined offset spacing (pitch) P for reasons described below, and are maintained in the desired "fixed-tilt" arrangement by a corresponding support structure 70-1, 70-2 and 70-3. In the present example, each support structure (e.g., support structure 70-3) includes a base 71 that serves to support a panel support structure 72 at an inclined angle $\theta$ relative to substantially level ground G, where panel support structure 72 supports panels 65-31 to 65-36. For descriptive purposes, panel support structure 72 includes an upper (horizontal) edge 73, a lower edge 74, and opposing left and right side edges 75 and 76, although outer edges of panels 65-31 to 65-36 may define these structure edges in some embodiments. Solar cells 80 are thus supported by and maintained in a planar array by a corresponding panel support structure 72 such that solar cells 80 are disposed over substantially all of the available surface of each frame 72 (i.e., the area bounded by upper edge 73, lower edge 74 and side edges 75 and 76). On each panel assembly 60-1, 60-2 and 60-3, solar cells 80 are electrically series-connected according to known techniques.

FIG. 15 is a simplified side elevation view showing PV panels 60-1 and 60-2 of PV farm 50, showing situations at noon time of various days for simplicity. The tilt angle $\theta$ is selected according to the latitude of the installation, to optimize the total amount of sunlight intercepted during the year. Typical tilt angle values are in the range of 0.7 to 1.0 times the latitude at which the PV farm is installed. As mentioned above, most fixed-tilt PV farms are and will be installed in the mid term future in latitudes between 25 and 60 degrees away from the equator, since this coincides with geographical regions of good insulation providing power availability and strong economic activity creating power demand. This observation limits the analysis and design to this range of latitudes, thereby simplifying the task at hand. At these latitudes, the sunlight beams $SL_E$ are directed at a predictable angle at the vernal and autumnal equinox, and varies around this direction as shown between sunlight beams $SL_{WS}$ having a relatively shallow angle $-\Delta$ (=23.5 degrees) at the winter solstice, and sunlight beams $SL_{SS}$ having a relatively steep angle $+\Delta$ at the summer solstice. Note that the active surface R formed by solar cells 80 of each panel (e.g., panel 60-1) defines a planar surface A. By knowing the incident angle of sunlight during the course of a year, fixed inclined angle θ can be selected to maximize the total amount of solar radiation captured by solar cells 80 during the course of a year. For example, as indicated in FIG. 15, inclined angle θ of PV panel 60-2 may be set such that sunlight beams $SL_E$ are normal to the active surface of solar cells 80A (i.e., such that solar cells 80A are optimally positioned to convert received sunlight during the equinox periods) in order to maximize the solar radiation captured during a twelve month period.

FIG. 15 also illustrates the required offset spacing (pitch) P for PV farms constructed at a given latitude. As mentioned above, solar cells 80 of each PV panel 60-1 and 60-2 are series-connected, and therefore it is important for maximum total power generation by each panel that each solar cell 80 produces a substantially equal amount of power. In order for this to occur, each solar cell 80 must receive the same amount of sunlight, and shading of any of the solar cells must be avoided. In particular, as indicated in FIG. 15, at the winter solstice, sunlight beams $SL_{WS}$ must pass over upper edge 74-1 of solar panel 60-1 without casting a shadow on the lowermost solar cells 80A of panel 60-2. To achieve this homogenous illumination of all solar cells, solar panels 60-1 and 60-2 must be separated by offset spacing P.

Depending on latitude and exact solar farm layout, a yearly aggregate of between approximately 30 and 80 percent more sunlight is available within the footprint of a standard fixed-tilt PV farm than is actually intercepted by the photovoltaic panels. This is due to the conservative offset spacing P typically employed with electrically series-connected modules, which pose a strong requirement for homogenous illumination (i.e., as explained above, each solar cell 80 must receive substantially the same amount of light in order to maintain optical power generation). The extra sunlight would normally be absorbed unused in the space between the panels. For example, as indicated in FIG. 15, summer solstice sunlight beams $SL_{SS1}$, $SL_{SS2}$ and $SL_{SS3}$ are indicated as passing directly onto ground G between panels 60-1 and 60-2, which illustrates a large amount of sunlight is not received by solar cells 80 during summer in order to provide homogenous illumination during winter.

What is needed is a low-cost sunlight redirecting element that can continue to redirect sunlight onto a fixed target even when the sunlight's incident direction changes over time, thereby facilitating the production of a low-cost, stationary solar systems (e.g., architectural daylighting systems and PV farms) for high northern or southern latitudes that efficiently utilize sunlight over a large portion of each year.

SUMMARY OF THE INVENTION

The present invention is directed to a low-cost sunlight redirecting element including multiple substantially identical redirecting structures uniformly arranged and fixedly disposed on a base, where each redirecting structure includes multiple optical surface regions that are cooperatively formed and arranged such that, when the sunlight redirecting element is operably fixedly oriented relative to a target surface with sunlight directed along an incident direction onto the redirecting structures, at least some of the sunlight is transmitted between the corresponding optical surface regions of each redirecting structure, and redirected from the corresponding optical surface regions toward the target surface. According to an aspect of the present invention, each redirecting element is constructed such that the redirected sunlight's angular distribution in the zenith plane is substantially independent of the direction of the incoming sunlight, and such that in yearly aggregate the redirecting element redirects 1.3 times more sunlight onto the solar cells than a perfect Lambertian scatterer of the same area. By utilizing multiple substantially identical redirecting structures where each redirecting structure includes multiple optical surface regions that are cooperatively formed and arranged in this manner, the present invention provides a low-cost sunlight redirecting element that can continue to redirect sunlight onto a fixed target even when the sunlight's incident direction changes over time, thereby facilitating the production of a low-cost, stationary solar systems (e.g., architectural daylighting systems and PV farms) for high northern or southern latitudes that efficiently utilize sunlight over a large portion of each year.

In accordance with various exemplary embodiments of the present invention, the base and optical surface regions are modified to produce a desired redirected sunlight pattern. In accordance with a first exemplary embodiment, the base is a planar substrate, and the redirecting structures are oriented identically and disposed on the planar substrate such that the redirected sunlight is directed along substantially identical diverging paths having substantially parallel nominal directions toward the target surface. In an alternative specific embodiments, the redirecting structures are oriented such that the redirected sunlight is directed along substantially identical diverging paths that fan out between the redirecting element the target surface to direct light onto a larger surface area. Such fanning out of the redirected sunlight may be achieved by orienting the redirecting structures identically on a flexible film that is then mounted on curved substrate. Alternatively, such fanning out may be achieved at level of the microoptical element's geometry by varying the shape parameters of the corresponding optical surface regions of each the redirecting structure to provide the desired deviation. Those skilled in the art will recognize the benefits and drawbacks associated with each of the delineated approaches, and will understand that alternative methods may be utilizes to achieve the desired redirected sunlight pattern.

In alternative embodiments, the redirecting and scattering function of each redirecting structure is achieved using at least two optical surfaces formed to implement an optical technology selected from refractive/reflective microoptics, light scattering optics, diffractive optics, holographic optics, gradient index optics, an optical system involving total internal reflection (TIR), or a combination of one or more of these optical technologies. By utilizing multiple redirecting structures, the present invention facilitates sunlight redirecting elements that redirect sunlight onto a fixed (stationary) target, even when the sunlight's incident direction changes over time.

In accordance with "focus and steer" embodiments of the present invention, each of the multiple redirecting structures of a sunlight redirecting element includes two curved optical surface regions arranged such that sunlight directed onto the first curved optical surface region is focused and redirected onto the corresponding second curved optical surface region, which then redirects the focused sunlight toward the target surface. In one specific "focus and steer" embodiment, the two curved optical surface regions are formed, for example, by applying a mirror material on curved lower surface regions of a transparent material layer (e.g., clear plastic, such as for example the acrylic material PMMA) having a light refracting planar upper surface, whereby each redirecting structure is formed by two corresponding curved reflective (mirror) surfaces arranged such that sunlight directed onto the first curved reflective surface is reflected and focused directly onto the second curved reflective surface. In a second specific "focus and steer" embodiment, the sunlight redirecting element includes a transparent material layer having a lower surface formed with an upward-facing planar mirror, and multiple parallel, parabolic cylinder (or similar elongated curved) upper surface sections, whereby each redirecting structure is formed by two adjacent upper surface sections that serve to refract and focus incident sunlight such that sunlight directed onto the first curved refractive surface is refracted and directed in a converging pattern onto the upward-facing planar mirror, and then reflected from the upward-facing planar mirror such that the still-converging sunlight is focused onto the second curved refractive surface. By properly shaping the first and second curved refractive surfaces, the redirected sunlight passing through the second curved refractive surface is directed in a predetermine direction, even when the incident direction of the sunlight changes over time. Thus, a benefit of the focus and steer arrangement described herein is the higher level of control that can be kept over the outgoing angular intensity distribution (i.e. compared to the strong broadening incurred in approaches using scattering elements, such as that used in the "reorient and scatter" approach, described below). This allows the focus and steer arrangement to redirect a larger fraction of the intercepted light towards the target surface. Furthermore, the manufacturing is easier, since there is no patterning of different surface types required on the same side of the substrate; instead, it is sufficient to provide a microoptical topography covering the front surface and covering the entire back surface with a reflective coating (e.g. such as a metallization, a classic thin film reflector or a polymeric Bragg type reflector).

In accordance with "reorient and scatter" embodiments of the present invention, each of the multiple redirecting structure of a sunlight redirecting element includes two planar optical surface regions arranged in a sawtooth pattern such that the two associated planar optical surface regions generally face each other, where one of the two planar optical surface regions is a reflective surface, and the other planar optical surface regions is a light scattering surface, and where each redirecting structure is arranged such that sunlight directed onto the first planar reflective surface region is reflected onto the corresponding planar scattering surface region. With this arrangement, the redirected sunlight from the scattering surface can be directed in a predetermined, substantially fixed (unchanging) direction, even when the incident direction of the sunlight changes over time. It should be noted that the directional distribution of the outgoing light is only weakly dependent on the direction of initial sunlight incidence after the scattering event. Comparing the described "reorient and scatter" arrangement with a planar simple Lambertian scattering surface, the (also Lambertian) scatterer utilized in the "reorient and scatter" arrangement is oriented in a direction that allows the strong normal portions of its intensity distribution to be coupled to the target surface.

In accordance with one specific "reorient and scatter" embodiment, the reflective and scattering surface regions of each redirecting structure are formed, for example, by applying a mirror material and a scattering material on respective planar lower surface sections of a transparent material layer having a light refracting planar upper surface. With this "reorient and scatter" arrangement, incident sunlight that is refracted by the planar upper surface and directed onto the reflective surface is reflected directly onto the associated light scattering surface, from which the redirected/scattered light is passed back through the planar upper surface toward the target surface. In one alternative specific embodiment of the "reorient and scatter" arrangement, the light scattering surface extends over the entire planar lower surface section of the transparent material layer. In a second alternative specific embodiment of the "reorient and scatter" arrangement, a small section that is reflective or includes additional is disposed between the light scattering surface and the V-shaped seam formed with the light reflecting surface. This additional small section allows light entering at steeper angles and being reflected close to the V-shaped seam to more effectively coupled to the target surface.

According to another embodiment of the present invention, a stationary sunlight redirecting system is provided that includes a sunlight redirecting element according to any of the embodiments described above that is maintained in a fixed (stationary) position relative to a target surface by a supporting structure. In one specific embodiment, the stationary sunlight redirecting system comprises an architectural daylighting arrangement in which a sunlight redirecting element is maintained on the upper surface of a light shelf and serves to redirect sunlight deep into an associated room throughout a given year. In another specific embodiment, the stationary sunlight redirecting system comprises a modified PV farm in which a sunlight redirecting element is positioned in unused space to redirect sunlight onto a PV panel during predetermined portions of each year.

BRIEF DESCRIPTION OF THE DRAWINGS

These and other features, aspects and advantages of the present invention will become better understood with regard to the following description, appended claims, and accompanying drawings, where:

FIG. 3 is a partial perspective view showing a "focus and steer" type sunlight redirecting element according to a first specific embodiment of the present invention;

FIGS. 4(A) and 4(B) are cross-sectional side views showing the sunlight redirecting element of FIG. 3 during operation;

FIG. 5 is a partial perspective view showing another "focus and steer" type sunlight redirecting element according to a second specific embodiment of the present invention;

FIGS. 6(A) and 6(B) are cross-sectional side views showing the sunlight redirecting element of FIG. 5 during operation;

DETAILED DESCRIPTION OF THE DRAWINGS

The present invention relates to systems and structures for improving the efficiency of fixed-tilt PV farms, and to low-cost light scattering films that can be used for this purpose. The following description is presented to enable one of ordinary skill in the art to make and use the invention as provided in the context of a particular application and its requirements. As used herein, directional terms such as "upper", "upward", "lower", "downward", "front", "rear", "horizontal" and "vertical" are intended to provide relative position and orientations for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
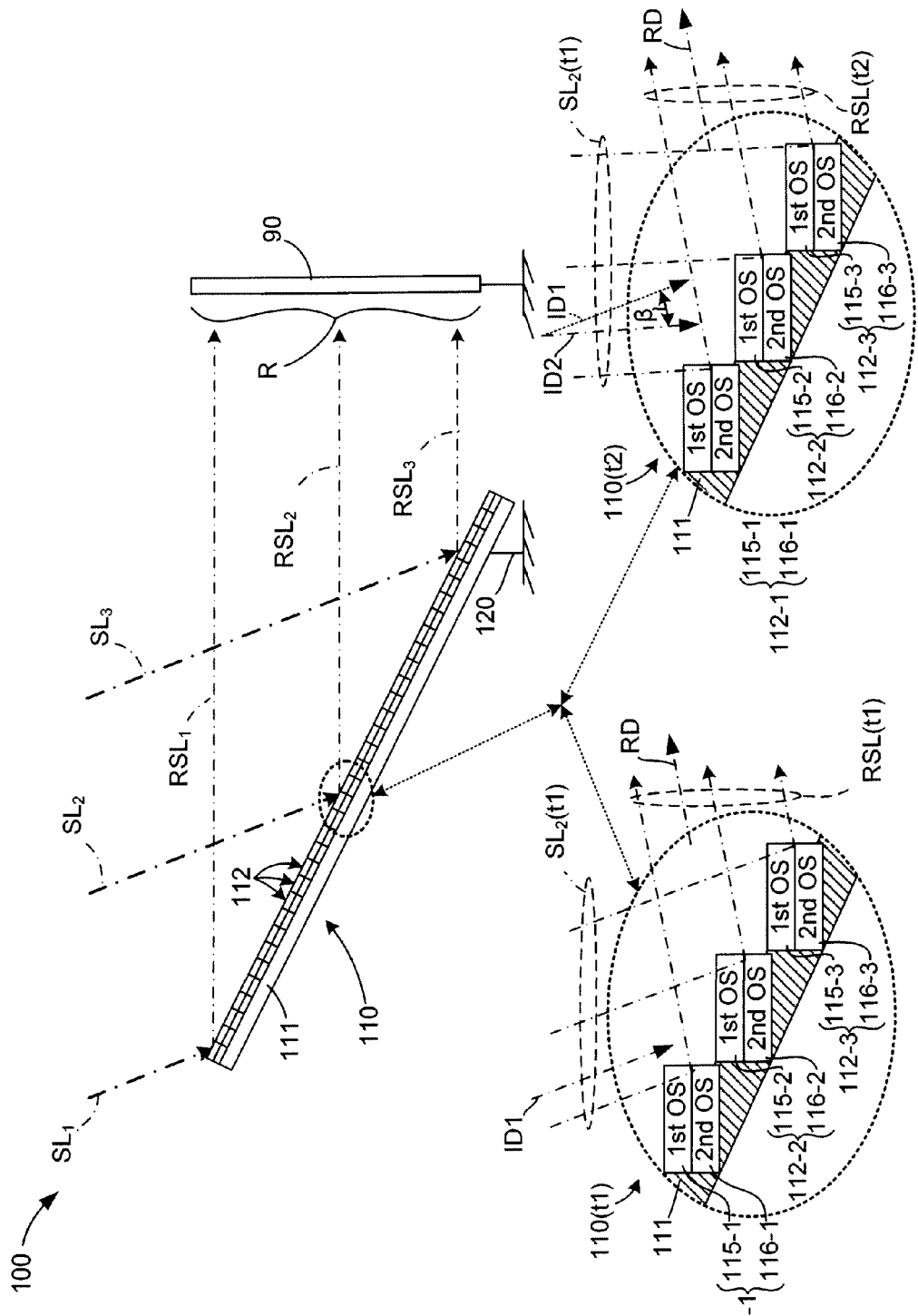
FIG. 1 is a simplified side view showing a portion of a low-cost stationary sunlight redirecting system including a sunlight redirecting element in accordance with a generalized embodiment of the present invention.

FIG. 1 is a simplified side view showing a generalized stationary sunlight redirecting system 100 according to the present invention, which generally includes a stationary target 90 having a target surface R, and a sunlight redirecting element 110 for redirecting sunlight SL onto target surface R.

According to a first aspect of the invention, sunlight redirecting element 110 includes multiple closely-spaced, substantially identical redirecting structures 112 uniformly arranged and fixedly disposed on a base 111, wherein each redirecting structures 112 includes multiple optical surface regions that are cooperatively formed and arranged to redirect sunlight toward target surface R such that the redirected sunlight is applied substantially homogenously (uniformly) by stationary target 90. For example, as indicated in the dashed bubbles at the lower portion of FIG. 1, a central region of sunlight redirecting element 110 includes redirecting structures 112-1, 112-2, and 112-3 uniformly arranged and fixedly disposed on base 111. Each redirecting structure 112-1, 112-2, and 112-3 includes at least two associated optical surface regions, which are indicated in a simplified block form in FIG. 1. For example, redirecting structure 112-1 includes a first optical surface (1st OS) region 115-1 and an associated second optical surface (2nd OS) region 116-1, redirecting structure 112-2 includes a first optical surface region 115-2 and an associated second optical surface region 116-2, and redirecting structure 112-3 includes a first optical surface region 115-3 and an associated second optical surface (2nd OS) region 116-3. Specific embodiments describing alternative arrangements of associated optical surface regions are provided below.

According to another aspect of the invention, each redirecting element 110 is constructed such that the redirected sunlight's angular distribution in the zenith plane is substantially independent of the direction of the incoming sunlight, and such that in yearly aggregate the redirecting element 110 redirects 1.3 times more sunlight onto the solar cells than a perfect Lambertian scatterer of the same area. In particular, each associated pair of optical surface regions of each redirecting structures 112 are cooperatively formed and arranged such that, when sunlight redirecting element 110 is operably fixedly oriented relative to target surface R with sunlight SL directed along an incident direction onto the redirecting structures 112 (e.g., as shown in FIG. 1), at least some of the sunlight is transmitted between the corresponding optical surface regions of each redirecting structure 112, and redirected from the corresponding optical surface regions toward the target surface in a predetermined, substantially fixed direction, even when the incident direction of the sunlight changes over time. For example, as indicted in the bubble located at the lower left portion of FIG. 1, at a first time t1 (e.g., during a winter month) when sunlight SL(t1) is directed along a relatively shallow incident direction ID1 onto redirecting structure 112-1, the sunlight is transmitted (e.g., reflected, refracted, scattered or otherwise redirected) between first optical surface region 115-1 and second optical surface region 116-x, and the redirected sunlight RL(t1) is directed away from redirecting structure 112-1 toward the target surface along a second direction RD. Similarly, parallel sunlight beams sunlight SL(t1) directed onto redirecting structures 112-2 and 112-3 are transmitted between associated optical surface regions 115-2/116-2 and 115-3/116-3, and are redirected toward the target surface substantially along second direction RD. In contrast, as indicted in the bubble located at the lower right portion of FIG. 1, at a second time t2 (e.g., during a summer month) when sunlight SL(t2) is directed along a relatively steep incident direction ID2 onto redirecting structure 112-1, the sunlight is transmitted (e.g., reflected, refracted or otherwise redirected) between first optical surface region 115-1 and second optical surface region 116-1, and the redirected sunlight RL(t2) is directed away from redirecting structure 112-1 toward the target surface along direction RD, where direction RD of redirected sunlight RL(t1) and RL(t2) at times t1 and t2 is substantially the same. Similarly, parallel sunlight beams sunlight SL(t2) directed onto redirecting structures 112-2 and 112-3 are transmitted between associated optical surface regions 115-2/116-2 and 115-3/116-3, and are redirected either parallel to or in a fixed angular relation to common direction RD. By utilizing multiple substantially identical redirecting structures (e.g., 112-1, 112-2 and 112-3), where each redirecting structure includes multiple optical surface regions (e.g., associated optical surface regions 115-1/116-1, 115-2/116-2 and 115-3/116-3) that are cooperatively formed and arranged, for example, in the manner set forth in the specific examples described below, the present invention provides a low-cost, stationary sunlight redirecting element that can continue to redirect sunlight onto a fixed target even when the sunlight's incident direction changes over time (e.g., one month or longer) or by a predetermined angle (e.g., as shown in the right bubble, an angle β between incident directions ID1 and ID2. In this way, by modifying existing solar systems (e.g., architectural daylighting systems and PV farms) located in high northern or southern latitudes to include redirecting element 110 in the manner described herein, the present invention facilitates improved performance through more efficient utilization of available sunlight over a large portion of each year.

Figure 2A:
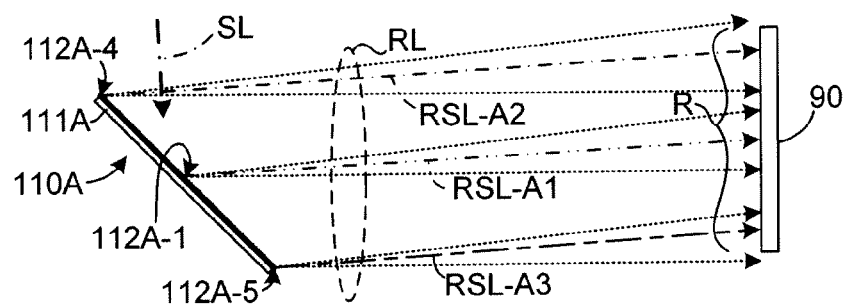
FIGS. 2(A), 2(B) and 2(C) are simplified cross-sectional side views showing various sunlight redirecting elements according to alternative embodiments of the present invention.
Figure 2B:
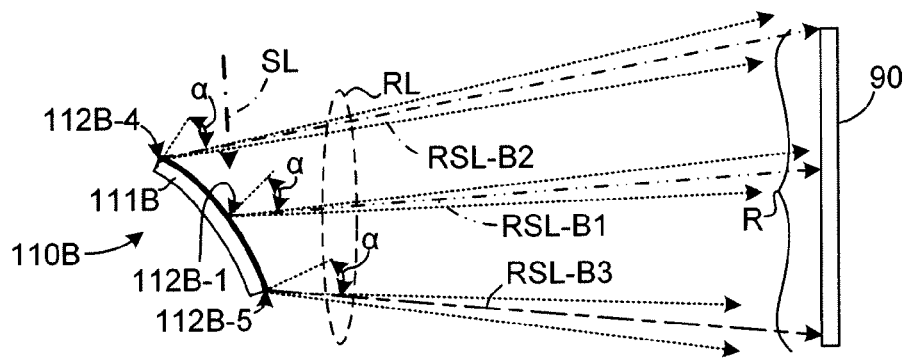
Figure 2C:
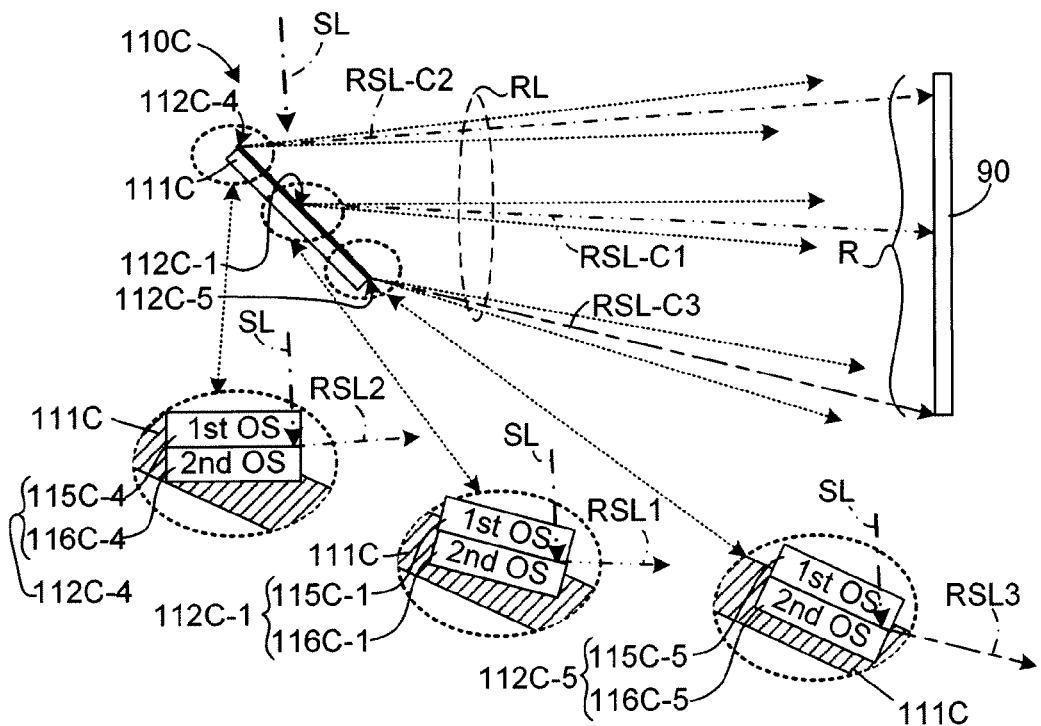

FIGS. 2(A), 2(B) and 2(C) are simplified side views illustrating alternative exemplary embodiments of the present invention, and specifically illustrate examples of how the base and redirecting structures of sunlight redirecting elements formed in accordance with the present invention may be modified to produce a desired redirected sunlight pattern.

FIG. 2(A) illustrates a first sunlight redirecting element 110A having a planar substrate base 111A, where all of the redirecting structures (e.g., central redirecting structure 112A-1 and outwardly positioned redirecting structures 112A-4 and 112A-5) are oriented identically and disposed on planar substrate base 111A such that redirected sunlight RL is directed along substantially identical divergent paths RSL-A1, RSL-A2 and RSL-A3 (indicated by dashed-line arrows), all of which having nominal directions (indicated by the central dashed-dot, dashed-dot-dot, or dash-dash-lined arrows) that are substantially parallel to common direction RD, toward target 90. In particular, for a given incident direction of sunlight SL, central redirecting structure 112A-1 redirects sunlight RL along a divergent path having nominal direction RSL-A1, and outwardly positioned redirecting structures 112A-4 and 112A-5 redirect sunlight RL along divergent paths having nominal directions RSL-A2 and RSL-A3 that are parallel with nominal direction RSL-A1. A benefit of this arrangement is that a high concentration of sunlight is received by target surface R, but this arrangement requires sunlight redirecting element 110A to have a size (area) that is larger than the fanned-out embodiments shown in FIGS. 2(B) and 2(C).

FIGS. 2(B) and 2(C) illustrate alternative sunlight redirecting elements arranged such that redirected sunlight RL is directed along non-parallel nominal paths that "fan out" between the redirecting element and target surface R, thereby allowing for a relatively small redirecting element and a relatively large target 90, although the concentration of sunlight received by target surface R may be less than that of the previous embodiment.

FIG. 2(B) shows a sunlight redirecting element 110B that achieves a fanned-out redirected sunlight pattern by utilizing a curved (e.g., semi-cylindrical) substrate base 111B and identical redirecting structures that are oriented identically, with each redirecting structure disposed such that redirected sunlight DL is directed at an angle relative to that redirecting structures' position on curved substrate base 111B. For example, redirecting structure 112B-1 is disposed on a central (first) region of curved substrate base 111B, and redirects sunlight SL along a divergent path nominally directed at an angle α relative to a direction normal to the central region of curved substrate base 111B such that the redirected sunlight is transmitted along an associated first nominal direction RSL-B1 toward a central region of target surface R. Similarly, redirecting structure 112B-4 is disposed on an upper (second) region of curved substrate base 111B, and redirects sunlight SL along a divergent path nominally directed at angle α relative to the upper region of curved substrate base 111B along an associated second nominal direction RSL-B2 toward an upper edge of target surface R, and redirecting structure 112B-5 is disposed on an lower region of curved substrate base 111B, and redirects sunlight SL along a divergent path nominally directed at angle α relative to the lower region of curved substrate base 111B along an associated third nominal direction RSL-B3 toward a lower edge of target surface 90, where second nominal direction RSL-B2 and third nominal direction RSL-B3 are "fanned out" (i.e., non-parallel) to first nominal direction RSL-B1. Sunlight redirecting element 110B is produced, for example, by forming the structure described above with reference to FIG. 2(A) on a flexible film that is then conformally disposed on a curved surface, which requires a two-step manufacturing process.

FIG. 2(C) shows an alternative sunlight redirecting element 110C that achieves a fanned out redirected sunlight pattern by utilizing a planar substrate base 111C and substantially identical redirecting structures that are individually oriented on base 111C to produce the desired fanned out redirected sunlight pattern. For example, redirecting structure 112C-1 is disposed on a central (first) region of planar substrate base 111C, and is oriented relative to planar substrate base 111C such that sunlight redirected by redirecting structure 112C-1 is transmitted along an associated first nominal direction RSL-C1 toward a central region of target surface R. In contrast, redirecting structure 112C-2 is disposed on an upper (second) region of planar substrate base 111C, and is oriented relative to planar substrate base 111C such that sunlight redirected by redirecting structure 112C-2 is transmitted along an associated second nominal direction RSL-C2 toward an upper region of target surface, and redirecting structure 112C-3 is disposed on a lower region of planar substrate base 111C, and is oriented such that its associated redirected sunlight is transmitted along a third nominal direction RSL-C3 toward a lower region of target surface R, where second nominal direction RSL-C2 and third nominal direction RSL-C3 are "fanned out" relative to first nominal direction RSL-C1. Sunlight redirecting element 110C is produced, for example, by forming a stamp or roller having the desired redirecting structure pattern, which allows for a single-step manufacturing process.

Sunlight redirecting elements according to the present invention will now be described with reference to certain specific embodiments in which each of the multiple redirecting structures utilize at least one of a light reflecting surface, a light refracting surface, and a light scattering surface. Although the present invention is described with specific reference to embodiments utilizing these optical technologies, those skilled in the art will recognize that the redirecting and scattering function of each redirecting element may also be achieved using one or more additional optical technologies selected from diffractive optics, holographic optics, gradient index optics, an optical system involving total internal reflection (TIR), or a combination of one or more of these optical technologies. Moreover, those skilled in the art will recognize that there is active past, present and future research into tailored scattering materials (e.g. using plasmonic effects, liquid crystals, etc.), the outcomes of which may be beneficially implemented in a system as described herein.

Further, according to the alternative specific embodiments of the present invention that are disclosed below, each redirecting element includes multiple redirecting structures made up of two or more optical surface regions that are preferably produced using an existing low-cost manufacturing technique such as hot embossing or film casting, both of which have been implemented at large scales in roll to roll fashion. Each of the two or more optical surface regions is formed with multiple curved or flat reflective, refractive or light scattering optical surface segments formed in accordance with a selected light redirecting or scattering arrangement. By utilizing low-cost manufacturing techniques to produce multiple redirecting structures on the base substrate of each redirecting element, the present invention facilitates the production of low-cost sunlight redirecting elements that can continue to redirect sunlight onto a fixed target even when the sunlight's incident direction changes over time.

Moreover, the redirecting elements of each of the alternative specific embodiments disclosed below is preferably optimized for the latitude in which it is used using known techniques. Such optimization may be achieved at the level of the microoptical element's geometry by varying the shape parameters of the corresponding optical surface regions of each of the redirecting structure to deviate from the base cases provided as examples in this specification. For example, in the case of the prismatic "reorient and scatter" embodiments described below with reference to FIGS. 7-10, the two angles assumed by each redirecting structure's optical surfaces can be adjusted to optimize each "reorient and scatter" for a given latitude (i.e., for a given range of sunlight incident angles). Preferably, this optimization is achieved by setting up the entire geometry in a ray tracing software program (such as the commercial packages Zemax, Fred, ASAP, TracePro, LightTools, etc.), using a pseudo light source formed by aggregating angular sky luminance data over a full year for the given location, and finally using the optimizers in these tools to maximize the minimum irradiance received by each target surface (e.g., a solar cell sized surface portion of a PV panel). Another level of optimization is found at the macroscopic scale, where the position and angle of the arrangement surface on which the redirecting elements are placed can be optimized in a similar fashion based on the base cases delineated herein.

FIGS. 3-6 illustrate exemplary sunlight redirecting elements that utilize a "focus and steer" arrangement according to alternative specific embodiments of the present invention. As set forth below, sunlight redirecting elements formed in accordance with the "focus and steer" arrangement are characterized in that each of their redirecting structures includes at least two curved optical surface regions arranged such that sunlight directed onto one of the two curved optical surface regions is focused and redirected onto the corresponding second curved optical surface region, which then redirects the sunlight toward the target surface. As set forth below, by properly shaping the two curved optical surface regions for a given latitude, the redirected sunlight reflected by the second curved reflective surface can be directed in a predetermined, substantially fixed (unchanging) direction, even when the incident direction of the sunlight changes over time. That is, the location at which the first curved reflective surface focuses the sunlight on the second curved reflective surface changes in accordance with a change in the incident sunlight direction, and the curve of the second curved reflective surface is shaped such that the redirected sunlight leaving the sunlight redirecting element is transmitted along a substantially fixed direction.

FIGS. 3, 4(A) and 4(B) illustrate a portion of a first exemplary sunlight redirecting element 100-1 including elongated redirecting structures 112-11 and 112-12 (additional redirecting structures, omitted for illustrative purposes, are disposed on the sides of redirecting structures 112-11 and 112-12). In the exemplary embodiment, each redirecting structure (e.g., redirecting structure 112-11) has a width W1 preferably in the range of 0.05 mm and 50 mm, as indicated in FIG. 3. The depicted length of each elongated redirecting structures 112-11 and 112-12 is purposefully shortened for illustrative purposes, and is preferably determined for each specific use.

According to an aspect of the present embodiment, each redirecting structure 112-11 and 112-12 includes a pair of curved reflective (mirror) surfaces that are formed, for example, in the shape of parabolic cylinder sections and are cooperatively fixedly arranged such that sunlight SL directed onto one of the curved reflective surface regions is reflected directly onto the associated second curved reflective surface region. For example, redirecting structure 112-11 includes a first curved reflective surface region 115-11 and an associated second curved reflective surface region 116-11, and redirecting structures 112-12 includes a first curved reflective surface region 115-12 and an associated second curved reflective surface region 116-12. The associated curved reflective surfaces (e.g., surface regions 115-11 and 116-11 are formed, for example, in the shape of parabolic cylinder sections that are cooperatively fixedly arranged such that sunlight SL directed onto first curved reflective surface 115-11 is reflected directly onto second curved reflective surface 116-11, as indicated in FIGS. 4(A) and 4(B) and described in additional detail below.

According to an aspect of the present embodiment, sunlight redirecting element 100-1 also includes a base 111-1 formed from a layer of transparent material layer (e.g., clear plastic, such as for example the acrylic material PMMA) having a planar upper surface 117-1 and an opposing lower surface 118-1, wherein the corresponding curved reflective surface regions of each redirecting structure are disposed on the lower surface 118-1 of base 111-1, and planar upper surface 117-1 is utilized to refract sunlight both entering and leaving base 111-1. In particular, as indicated in FIG. 3, corresponding curved reflective surface regions 115-11 and 116-11 of redirecting structure 112-11 are disposed on corresponding sections 118-115 and 118-116 of lower surface 118-1, and curved reflective surface regions 115-12 and 116-12 of redirecting structure 112-12 are disposed on corresponding sections 118-125 and 118-126 of lower surface 118-1. As shown in FIG. 4(A), sunlight SL(t1) directed along incident direction ID1 onto a region 117-1A of planar upper surface 117-1 is refracted onto curved reflective surface region 115-11, which reflects the sunlight onto a region 116-111 of second curved reflective surface region 116-11, and the sunlight that is reflected from region 116-111 of second curved reflective surface region 116-11 is directed through planar surface 117-1, which again acts to refract the sunlight into desired direction RD such that the redirected sunlight is transmitted toward the target surface (not shown). By providing base 111-1 with planar upper surface 117-1, the present embodiment facilitates low-cost maintenance in that cleaning of planar upper surface 117-1 is easily performed. The top layer may be a sandwich of one or more materials without substantially changing the described function if consistent refractive indices are chosen. This is useful if the surface layer is desired to be made of a different material (e.g. glass) than the moldable plastic material in which the optical surfaces are formed. Possible benefits are improved cleanability, UV resistance and lower perceived uncertainty in deployment.

According to another aspect of the present embodiment, the associated curved reflective surface regions of each redirecting structure are arranged such that, as the incident angle of the sun changes during at least a portion of the year, the redirected sunlight leaving the sunlight redirecting element 110-1 remains unchanged. This feature is illustrated with reference to FIGS. 4(A) and 4(B), where FIG. 4(A) shows sunlight redirecting element 110-1 at a first time t1 (e.g., during a winter month) when sunlight SL(t1) is directed along a relatively shallow incident direction ID1 onto redirecting structure 112-11, and FIG. 4(B) shows sunlight redirecting element 110-1 at a second time t2 (e.g., during a summer month) when sunlight SL(t2) is directed along a relatively steep incident direction ID2 onto redirecting structure 112-11. As described above and indicated by the dashed-lined arrows in FIG. 4(A), sunlight SL(t1) passing through region 117-1A of planar upper surface 117-1 is refracted onto curved reflective surface region 115-11, which reflects and focuses the sunlight onto region 116-111 of second curved reflective surface region 116-11, and the sunlight reflected from region 116-111 is directed back through planar surface 117-1, which refracts the sunlight into desired direction RD. By comparison, referring to the dashed-lined arrows in FIG. 4(B), sunlight SL(t2) is refracted by a region 117-1B of planar upper surface 117-1 onto curved reflective surface region 115-11, which reflects and focuses the sunlight onto region 116-112 of second curved reflective surface region 116-11. Note that, because of the steeper incident direction ID2 of sunlight SL(t2), the position of region 116-112 (e.g., the focal point of the sunlight focused by curved reflective surface region 115-11) is different from that at time t1, and the angle of second curved reflective surface region 116-11 at region 116-112 is different (e.g., shallower) than that at region 116-111. By designing second curved reflective surface region 116-11 such that sunlight reflected from either of regions 116-111 and 116-112 is directed back through planar surface 117-1 at the same angle, as illustrated by FIGS. 4(A) and 4(B), redirected sunlight RSL(t1) and redirected sunlight RSL(t2) have a common direction RD. Thus, a benefit of sunlight redirecting element 110-1 is the higher level of control that can be kept over the outgoing angular intensity distribution (i.e. compared to the strong broadening incurred in approaches using scattering elements, such as that used in the "reorient and scatter" approach, described below). This allows the focus and steer arrangement to redirect a larger fraction of the intercepted light towards the target surface.

According to yet another aspect of sunlight redirecting element 110-1 as illustrated in FIG. 4(A), the curved reflective surface regions of each redirecting structure 112-1 and 112-3 are formed by depositing a mirror material onto preformed curved sections of base 111-1. For example, as shown in FIG. 4(A), first curved reflective surface region 115-11 is formed by depositing a mirror material layer portion 119-115 on a corresponding curved section 118-115 of lower surface 118-1, and second curved reflective surface region 116-11 is formed by depositing a mirror material layer portion 119-116 on a corresponding curved section 118-115 of lower surface 118-1. By providing base 111-1 with a microoptical topography covering lower surface 118-1 as described above and then forming curved reflective surface regions 115-11 and 116-11 by covering the entire lower surface 118-1 with a reflective coating (e.g. such as a metallization, a classic thin film reflector or a polymeric Bragg type reflector), manufacturing process needed to form sunlight redirecting element 110-1 is greatly simplified, thereby minimizing manufacturing costs.

FIGS. 5, 6(A) and 6(B) illustrate a portion of a second exemplary sunlight redirecting element 100-2 including redirecting structures 112-21, 112-22 and 112-23 (additional redirecting structures, omitted for illustrative purposes, are disposed on the sides of these redirecting structures.

According to a first aspect of the present embodiment, sunlight redirecting element 100-2 includes a base 111-2 formed from a layer of transparent material layer (e.g., clear plastic, such as for example the acrylic material PMMA) having an upper surface 117-2 formed by parallel elongated parabolic cylindrical sections (e.g., sections 117-21, 117-22, 117-23 and 117-24) and a planar lower surface 118-2, and the corresponding curved optical surface regions of each redirecting structure are implemented by corresponding elongated parabolic cylindrical sections disposed on upper surface 117-2 of base 111-2. For example, redirecting structure 112-21 includes corresponding curved refractive surface regions 115-21 and 116-21, which are implemented by elongated parabolic cylindrical sections 117-21 and 117-22, respectively. Similarly, redirecting structure 112-22 includes corresponding curved refractive surface regions 115-22 and 116-22, which are implemented by elongated parabolic cylindrical sections 117-22 and 117-23, respectively, and redirecting structure 112-23 includes corresponding curved refractive surface regions 115-23 and 116-23, which are implemented by elongated parabolic cylindrical sections 117-23 and 117-24, respectively. As set forth below in greater detail, because redirecting structures 112-21 to 112-23 "share" parallel elongated parabolic cylindrical sections 117-21 to 117-24, sunlight redirecting element 100-2 is arranged to redirect a higher percentage of the incident sunlight toward the target surface.

According to another aspect of the present embodiment, a planar reflective surface 119-2 is disposed on lower surface 118-2 of the transparent material layer 111-2, and the associated curved optical surface regions of each redirecting structure are shaped and arranged in a manner similar to that described in the previous embodiment such that sunlight is refracted by one curved optical surface region onto planar reflective surface 119-2 such that the sunlight is reflected by planar reflective surface 119-2 and focused on a section of the corresponding second curved optical surface region. For example, as shown in FIG. 6(A), sunlight SL(t1) directed along incident direction ID1 onto first curved refractive surface region 115-21 (i.e., parallel elongated parabolic cylindrical section 117-21 of planar upper surface 117-2) is refracted onto planar reflective surface 119-2 such that the sunlight reflected from planar reflective surface 119-2 is focused onto a region 116-211 of second curved refractive surface region 116-21 (i.e., section 117-22 of planar upper surface 117-2), and the sunlight that passes through region 116-211 is directed in the desired direction RD such that the redirected sunlight is transmitted toward the target surface (not shown). By providing base 111-2 with surface 117-2, the present embodiment facilitates low-cost maintenance in that cleaning of planar upper surface 117-2 is relatively easily to perform, although more difficult than that provided by the planar upper surface of the previous embodiment.

According to another aspect of the present embodiment, the associated curved refractive surface regions of each redirecting structure are arranged such that, as the incident angle of the sun changes during at least a portion of the year, the redirected sunlight leaving the sunlight redirecting element 110-2 remains unchanged. This feature is illustrated with reference to FIGS. 6(A) and 6(B), where FIG. 6(A) shows sunlight redirecting element 110-2 at a first time t1 (e.g., during a winter month) when sunlight SL(t1) is directed along a relatively shallow incident direction ID1 onto redirecting structure 112-21, and FIG. 6(B) shows sunlight redirecting element 110-2 a second time t2 (e.g., during a summer month) when sunlight SL(t2) is directed along a relatively steep incident direction ID2 onto redirecting structure 112-21. As described above and indicated by the dashed-lined arrows in FIG. 6(A), sunlight SL(t1) passing through first curved refractive surface region 115-21 (i.e., parallel elongated parabolic cylindrical section 117-21 of planar upper surface 117-2) is refracted onto planar reflective surface 119-2, which reflects the sunlight onto region 116-211 of second curved refractive surface region 116-21, and the sunlight refracted from region 116-211 is directed into desired direction RD. By comparison, referring to the dashed-lined arrows in FIG. 6(B), sunlight SL(t2) is refracted by second curved refractive surface region 116-21 (i.e., parallel elongated parabolic cylindrical section 117-22 of planar upper surface 117-2) onto planar reflective surface 119-2, which reflects the sunlight onto region 116-212 of second curved refractive surface region 116-21. Note that, because of the steeper incident direction ID2 of sunlight SL(t2), the position of region 116-212 (e.g., the focal point of the sunlight focused by curved refractive surface region 115-21) is different from the focus point at time t1, and the angle of second curved refractive surface region 116-21 at region 116-212 is different than angle of second curved refractive surface region 116-21 at region 116-211. That is, when the reflected sunlight passes through second curved refractive surface region 116-21, refractive surface region 116-21 acts similar to a field lens: that is, it does not change the sunlight bundle's divergence (which will stay divergent, and not be collimated again to the original near parallel sunlight angular spectrum) but ensures that the bundles arising for different incidence directions are steered in substantially the same direction RD. This effect is achieved because the focus spot (e.g. regions 116-211 and 116-212) wanders around with varying angle of sunlight incidence, being subject to the locally different refractive slope found on the hit portion of the fixed lens formed by refractive surface region 116-21. In effect, a stabilization of the outgoing light is achieved, which comes at the price of broadening the angular spectrum of the originally well collimated sunlight due to the principle of Etendue conservation. This price is well acceptable in the case of a large and close target surface, since it presents itself subtending a relatively large angle in zenith direction. Note that is possible to enhance the homogeneity of the spatial irradiance distribution on the target surface by deviating from cylindrical lenslets towards free forms, which may result from optimization for a specific spacial geometry. It should also be noted that the optimization task is an overconstrained one due to the double usage of the same lenslet surfaces as focusing lenses and field lenses, but dealing with overconstrained systems is a situation routinely encountered and mastered by those skilled in the art of computer aided optics optimization.

In the specific embodiment described above, parallel sunlight beams are described as being focused by one of the elongated curved sections (e.g., section 117-21) forming upper surface 117-2, and then reflected from planar reflective surface 119-2 back toward the elongated curved sections such that the bundles of rays come to a focus in the vicinity of an immediately adjacent curved sections (e.g., section 117-22). In an alternative embodiment the elongated curved sections and thickness of base 111-2 may be set such that the reflected light "skips" the adjacent section and possibly hits the next sections 117 (e.g., section 117-23).

FIGS. 7-10 illustrate exemplary sunlight redirecting elements that utilize a "reorient and scatter" arrangement according to further alternative specific embodiments of the present invention. As set forth below, sunlight redirecting elements formed in accordance with the "reorient and scatter" arrangement are characterized in that each of their redirecting structures includes at least two planar optical surface regions arranged such that sunlight directed onto one of the two planar optical surface regions is redirected (e.g. reflected) onto the corresponding second planar optical surface region, and the second planar optical surface region scatters the sunlight such that a portion of the scattered sunlight is redirected toward the target surface. This is superior to a simple scattering sheet material, since it enables orienting the scattering surface region in such a way that the peak of its angular scatter distribution points to the target (taking into account refraction on the way). As set forth below, by properly orienting the two optical surface regions for a given latitude, the redirected sunlight from the scattering surface can be directed in a predetermined, substantially fixed (unchanging) direction, even when the incident direction of the sunlight changes over time.

Figure 7:
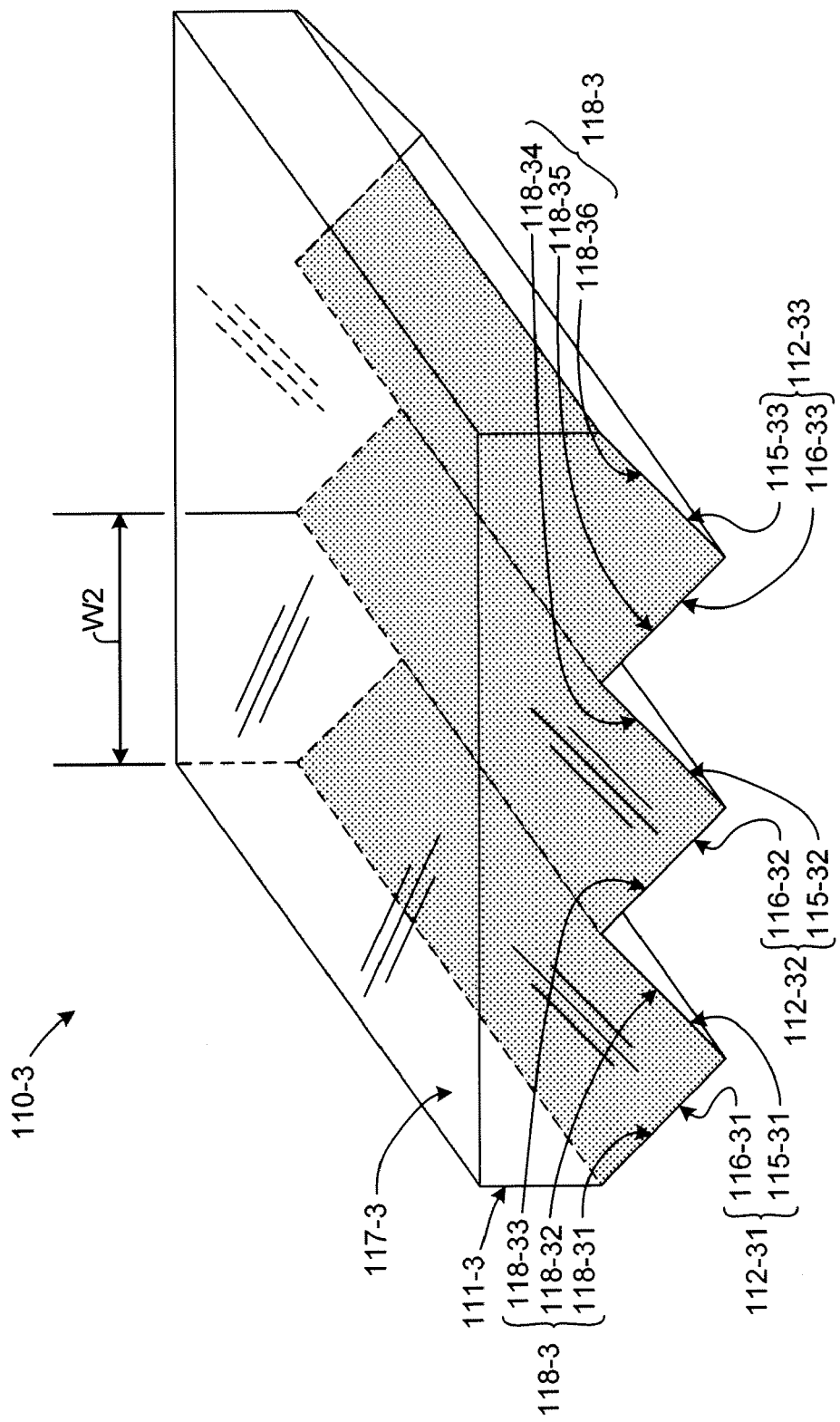
FIG. 7 is a partial perspective view showing a "reorient and scatter" type sunlight redirecting element according to a third specific embodiment of the present invention.
Figure 8A:
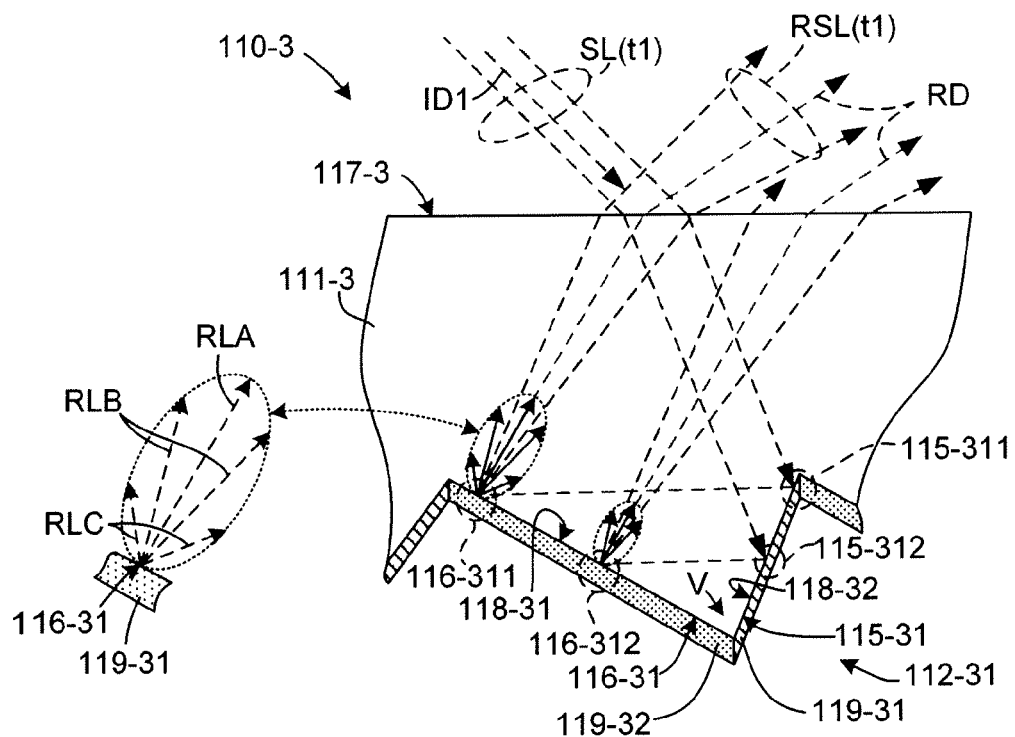
FIGS. 8(A) and 8(B) are cross-sectional side views showing the sunlight redirecting element of FIG. 7 during operation.
Figure 8B:
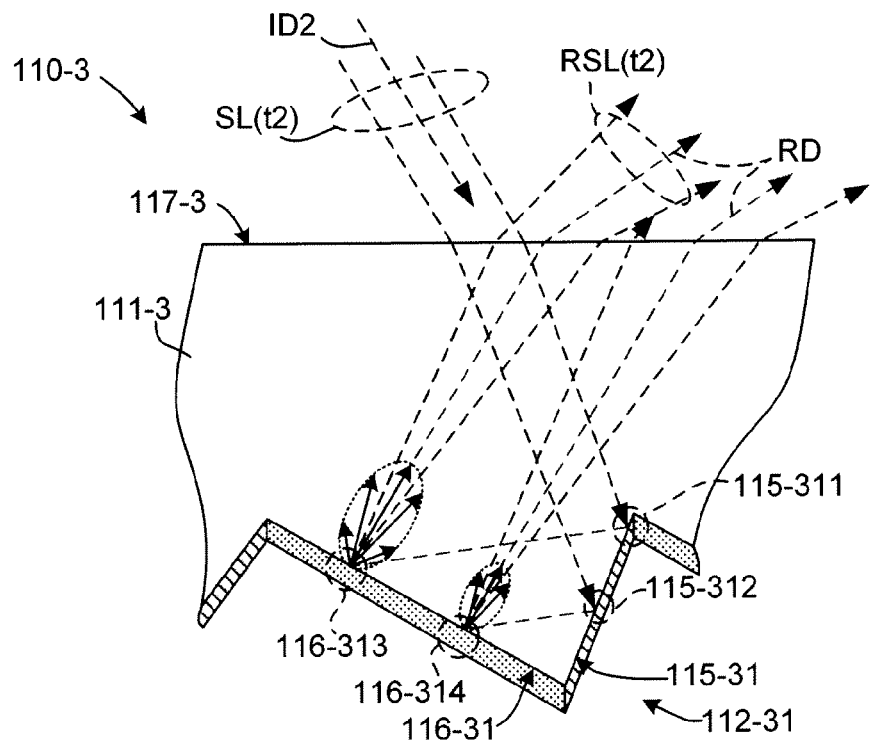

FIGS. 7, 8(A) and 8(B) illustrate a portion of a first exemplary "reorient and scatter" sunlight redirecting element 100-3 including redirecting structures 112-31, 112-32 and 112-33 (additional redirecting structures, omitted for illustrative purposes, are disposed on the sides of redirecting structures 112-31 and 112-33). In the exemplary embodiment, each redirecting structure (e.g., redirecting structure 112-31) has a width W2 in the range of 0.01 mm and 50 mm, as indicated in FIG. 7. The depicted length of each elongated redirecting structures 112-31 to 112-33 is purposefully shortened for illustrative purposes, and is preferably determined for each specific use.

According to an aspect of the present embodiment, sunlight redirecting element 100-3 includes planar optical surface regions arranged in a sawtooth pattern such that two associated planar optical surface regions associated with each redirecting structure 112-31 to 112-33 generally face each other, where one of the two planar optical surface regions is a reflective surface, and the other planar optical surface regions is a light scattering surface, and where each redirecting structure 112-31 to 112-33 is arranged such that sunlight directed onto the reflective surface region is reflected onto the corresponding planar scattering surface region. For example, redirecting structure 112-31 includes planar reflective surface region 115-31 and planar scattering surface region 116-31, redirecting structure 112-32 includes planar reflective surface region 115-32 and planar scattering surface region 116-32, and redirecting structure 112-33 includes planar reflective surface region 115-33 and planar scattering surface region 116-33. As indicated in FIG. 8(A), the associated reflective and scattering surfaces (e.g., surface regions 115-31 and 116-31) are cooperatively fixedly arranged such that sunlight SL(t1) onto a region 115-311 of reflective surface region 115-31 is reflected onto a region 116-311 of planar scattering surface region 116-31, and sunlight SL(t1) directed onto a region 115-312 of reflective surface region 115-31 is reflected onto a region 116-312 of planar scattering surface region 116-31. As depicted by the ray diagram shown in the bubble on the left side of FIG. 8(A), light scattering surface 116-31, which is implemented in one embodiment as a white opaque surface (e.g. generated by roughening, painting, etching, embossing of fine features, etc.) generates a scattered light pattern (e.g. a Lambertian pattern) in which the highest luminous intensity of the scattered light (indicated by arrows RLA and RLB) is observed as directed normal to the planar surface forming light scattering surface 116-31. This scatter pattern occurs no matter where the sunlight strikes light scattering surface 116-31, so the sunlight is reflected in substantially the same pattern from both regions 116-311 and 116-312 of planar scattering surface region 116-31. In addition, as indicated in FIG. 8(B), the direction of the scattered light distribution is substantially the same as that at time t1 when the direction of the reflected sunlight changes. Thus, the directional distribution of the outgoing scattered light is only weakly dependent on the direction of initial sunlight incidence after the scattering event. Comparing the described "reorient and scatter" arrangement with a planar simple Lambertian scattering surface, the (also Lambertian) scatterer utilized in the "reorient and scatter" arrangement is oriented in a direction that allows the strong normal portions of its intensity distribution to be coupled to the target surface. Therefore, with the depicted "reorient and scatter" arrangement, the redirected sunlight leaving scattering surface 116-31 can be directed in a predetermined, substantially fixed (unchanging) direction, even when the incident direction of sunlight SL(t1) changes over time.

According to an aspect of the present embodiment, sunlight redirecting element 100-3 also includes a base 111-3 formed from a layer of transparent material layer (e.g., clear plastic, such as for example the acrylic material PMMA) having a planar upper surface 117-3 and an opposing lower surface 118-3 including planar surface sections 118-31 to 118-36 arranged in a sawtooth pattern, with the reflective and scattering surface regions of each redirecting structure 112-31 to 112-33 being formed by reflective/light scattering material disposed on corresponding sections of lower surface 118-3, and with planar upper surface 117-3 being utilized to refract sunlight both entering and leaving base 111-3. In particular, as indicated in FIG. 7, reflective surface region 115-31 and scattering surface region 116-31 of redirecting structure 112-31 are disposed on corresponding sections 118-32 and 118-31 of lower surface 118-3, reflective surface region 115-32 and scattering surface region 116-32 of redirecting structure 112-32 are disposed on corresponding sections 118-34 and 118-33, and reflective surface region 115-33 and scattering surface region 116-33 of redirecting structure 112-33 are disposed on corresponding sections 118-36 and 118-35. As shown in FIG. 8(A), reflective surface region 115-31 of redirecting structure 112-31 is formed by a reflective material layer 119-31 deposited or otherwise formed on section 118-32 of lower surface 118-3, and scattering surface region 116-31 of redirecting structure 112-31 is formed by a light scattering material layer 119-32 deposited or otherwise formed on section 118-31 of lower surface 118-3. Thus, each corresponding reflective/scattering surface pair of each redirecting structure 112-31 to 112-33 meets at a V-shaped seam formed by the sawtooth pattern. For example, as shown in FIG. 8(A), reflective surface region 115-31 abuts corresponding scattering surface region 116-31 at an elongated V-shaped seam (indicated by "V" in FIG. 8(A)) that is formed by sections 118-31 and 118-32 of lower surface 118-3. During operation, as shown in FIG. 8(A), sunlight SL(t1) directed along incident direction ID1 onto planar upper surface 117-3 is refracted onto reflective surface region 115-31, which reflects the sunlight onto scattering surface region 116-31, and the sunlight that is scattered by surface region 116-31 is directed through planar surface 117-3, which again acts to refract the sunlight into desired direction RD such that the redirected sunlight is transmitted toward the target surface (not shown). In some situations, there may be blocking of part of the scatter distribution by the first surface (particularly light scattered deep inside the V-groove). This undesirable side effect is mitigated to some degree by the current embodiment with a transparent material, since the refraction at the front interface results in angles in the transparent material that are closer to the front surface's normal, and therefore less affected by blocking.

According to another aspect of the present embodiment, the light scattering surface regions of each redirecting structure are arranged such that, as the incident angle of the sun changes during at least a portion of the year, the redirected/scattered sunlight distribution leaving the sunlight redirecting element 110-3 remains unchanged. This feature is illustrated with reference to FIGS. 8(A) and 8(B), where FIG. 8(A) shows sunlight redirecting element 110-3 at a first time t1 when sunlight SL(t1) is directed along incident direction ID1, and FIG. 8(B) shows sunlight redirecting element 110-3 at a second time t2 when sunlight SL(t2) is directed along a relatively steep incident direction ID2 onto redirecting structure 112-31. As described above and indicated by the dashed-lined arrows in FIG. 8(A), sunlight SL(t1) passing through planar upper surface 117-3 is refracted onto reflective surface region 115-31, which reflects the sunlight onto scattering surface region 116-31, and the sunlight scattered from surface region 116-31 is directed back through planar surface 117-3, which refracts the sunlight into desired direction RD. By comparison, referring to the dashed-lined arrows in FIG. 8(B), sunlight SL(t2) is refracted by planar upper surface 117-3 onto similar regions 115-311 and 115-312 of reflective surface region 115-31 as that shown in FIG. 8(A), but due to the steeper incident direction ID2, reflects the sunlight onto regions 116-313 and 116-314 of scattering surface region 116-31. Because of the light scattering function of scattering surface region 116-31, described above, the scattered sunlight directed away from regions 116-313 and 116-314 is directed back toward planar surface 117-3 at substantially the same angle as that shown in FIG. 8(A), and is therefore the sunlight RSL(t2) refracted by planar surface 117-3 at time t2 has substantially the same direction RD as sunlight RSL(t1) refracted by planar surface 117-3 at time t1 (see FIG. 8(A)).

Figure 9:
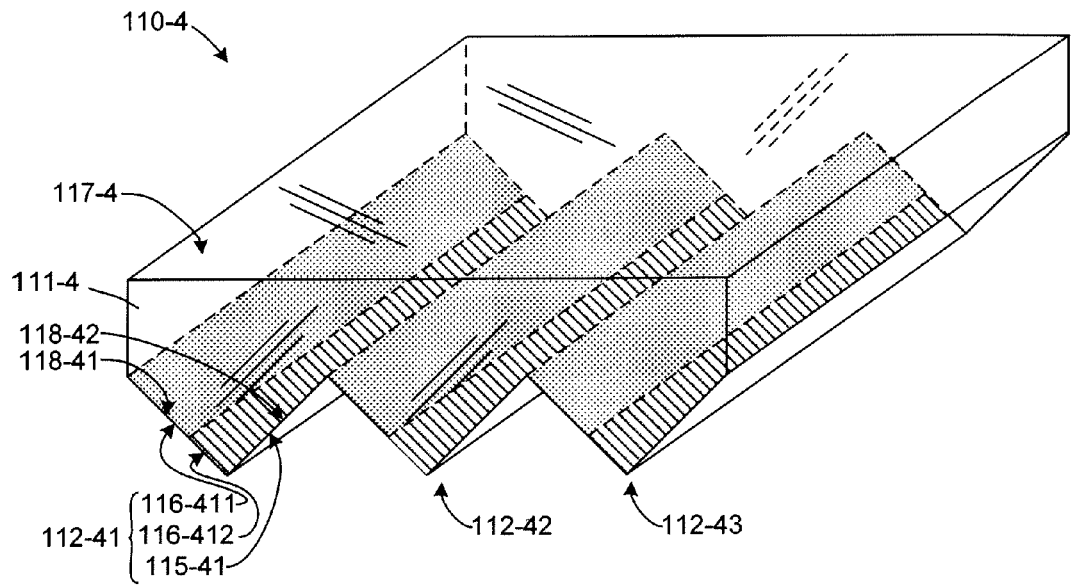
FIG. 9 is a partial perspective view showing another "reorient and scatter" sunlight redirecting element according to a fourth specific embodiment of the present invention.
Figure 10:
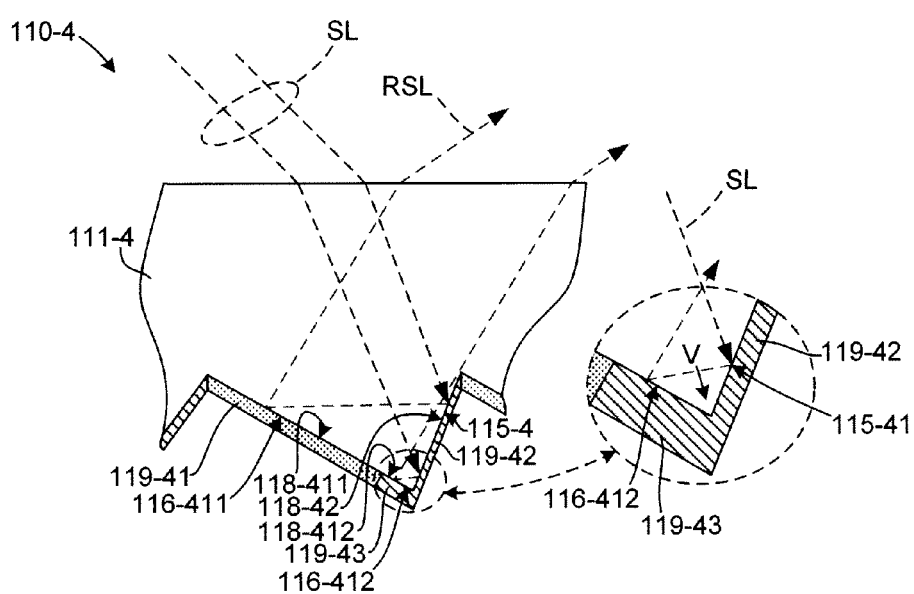
FIG. 10 is a cross-sectional side view showing the sunlight redirecting element of FIG. 9 during operation.

FIGS. 9 and 10 illustrate a portion of a second exemplary "reorient and scatter" sunlight redirecting element 100-4 according to another specific embodiment of the present invention. Similar to redirecting element 100-3 (discussed above), redirecting element 100-4 is formed on a transparent material base 111-4 having a planar upper surface 117-4 and a lower surface formed in a sawtooth pattern (e.g., as indicated by surface regions 118-411/118-412 and 118-42), and each redirecting structures 112-41, 112-42 and 112-43 redirecting element 100-4 includes two planar optical surface regions disposed on the sawtooth pattern, where one of the two planar optical surface regions includes a reflective surface, and the other planar optical surface regions includes a light scattering surface, and where each redirecting structure 112-31 to 112-33 is arranged such that sunlight directed onto at least a portion of the reflective surface region is reflected onto the corresponding planar scattering surface region. For example, as indicated in FIGS. 9 and 10, redirecting structure 112-41 includes a planar reflective surface region 115-41 formed by a reflective material portion 119-42 disposed on region 118-42, and a planar scattering surface region 116-411 formed by a light scattering material layer 119-41 disposed on region 118-411. As indicated in FIG. 10, sunlight SL directed onto the upper portion of reflective surface region 115-41 is directed onto scattering surface region 116-411, which scatters and redirects the sunlight substantially as described above with reference to redirecting element 100-3 such that redirected sunlight RSL is directed toward the target surface (not shown).

According to an aspect of the present embodiment, redirecting element 100-4 also includes a narrow elongated small reflective section 116-412 that is disposed between light scattering surface 116-411 and the V-shaped seam "V" formed with the light reflecting surface 115-41, where reflective section 116-412 is formed, for example, by depositing a reflective material portion 119-43 on region 118-412 of base 111-4, or by providing additional microtopography in region 118-412. Additional reflective section 116-412 allows light entering base 111-4 at steeper angles and reflected close to V-shaped seam V to more effectively couple to the target surface. Rays intercepting in this region may be sent up more steeply to avoid the unfavorable blocking geometry in this region, or may be sent back to the reflecting surface at an angle shallow enough, that their reflection reaches the scattering surface in a more favorable region further from the apex. In some cases, total internal reflection at the front interface between the transparent material and the surrounding air may be utilized for this recycling of light.

Referring again to FIG. 1, according to another embodiment of the present invention, stationary sunlight redirecting system 100 is provided that includes sunlight redirecting element 110 according to any of the embodiments described above, and a supporting structure 120 for maintaining sunlight redirecting element 110 in a fixed (stationary) position relative to stationary target surface 90. The generalized system shown in FIG. 1 is described with reference to specific exemplary examples disclosed with reference to FIGS. 11 and 12.

Figure 11A:
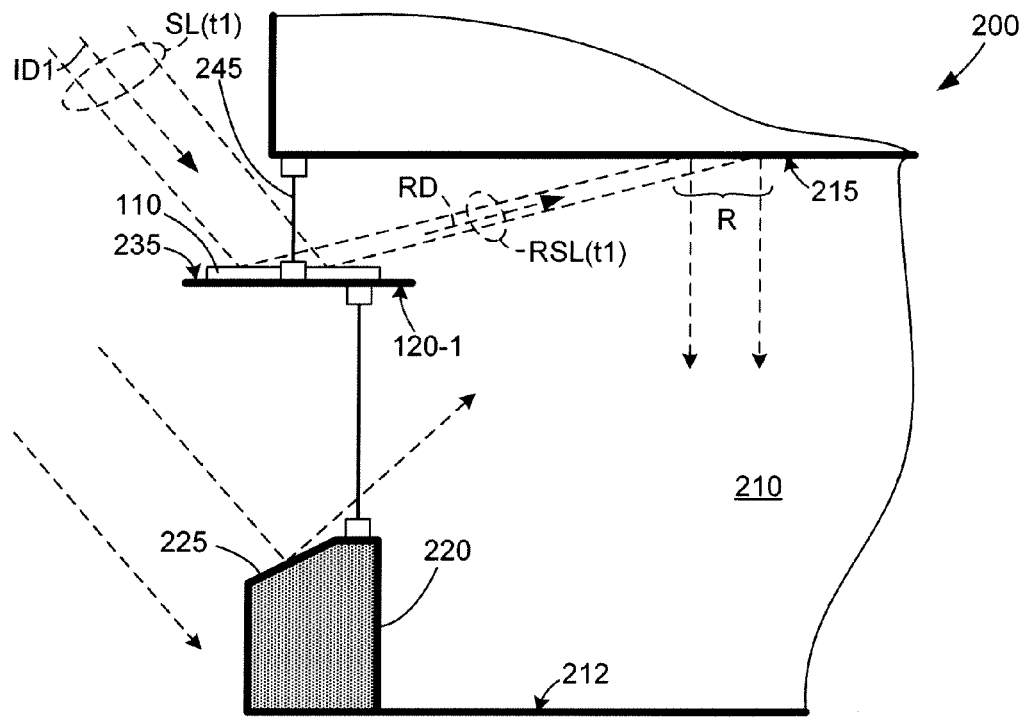
FIGS. 11(A) and 11(B) are simplified side elevation views showing a modified architectural lighting-type stationary sunlight redirecting system utilizing a stationary sunlight redirecting element according to another embodiment of the present invention.
Figure 11B:
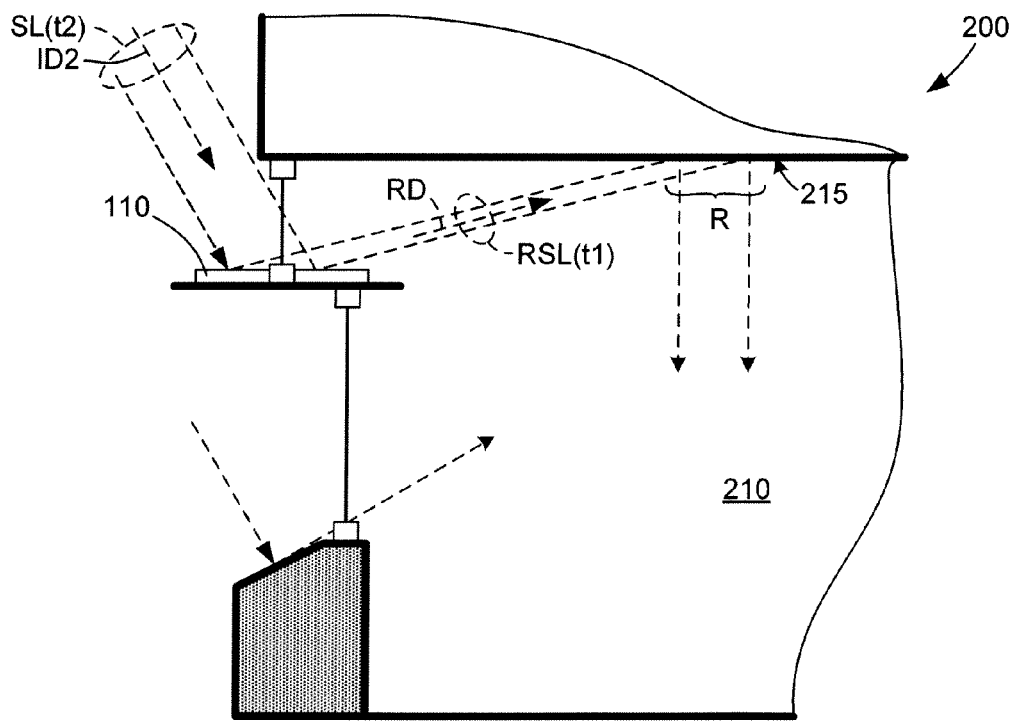

FIGS. 11(A) and 11(B) show a stationary sunlight redirecting system 200 consisting of an architectural daylighting arrangement formed as part of a room 210 having an outer wall 220 in which a sunlight redirecting element 110 is maintained on the upper surface 235 of a light shelf 120-1 disposed on or above outer wall 220, where the light shelf is the support structure that maintains redirecting element 110 in a stationary position relative to a target surface R (i.e., a portion of a ceiling surface 215 of room 210). As indicated in FIG. 11(A), light shelf 120-1 is disposed under a high window 245 to allow light redirected by redirecting element 110 to enter room 210. Due to the characteristics of sunlight redirecting element 110 that are discussed above, sunlight is redirected by sunlight redirecting element 110 onto target surface R (i.e., relatively deep inside room 210) throughout the year, thereby addressing the problems associated with conventional architectural daylighting arrangements. This feature is illustrated in FIGS. 11(A) and 11(B), where FIG. 11(A) shows system 200 at a first time t1 (e.g., during a winter month) when sunlight SL(t1) is directed along a relatively shallow incident direction ID1 onto redirecting element 110, and FIG. 11(B) shows 200 at a second time t2 (e.g., during a summer month) when sunlight SL(t2) is directed along a relatively steep incident direction ID2 onto redirecting element 110. As described above and indicated by the dashed-lined arrows in FIGS. 11(A) and 11(B), incident sunlight SL(t1) and SL(t2) are both redirected by redirecting element 110 such that redirected sunlight RSL(t1) and RSL(t2) are transmitted at substantially the same direction RD to target surface R, whereby light is scattered downward as shown to consistently light room 210 during both winter and summer months.

Figure 12:
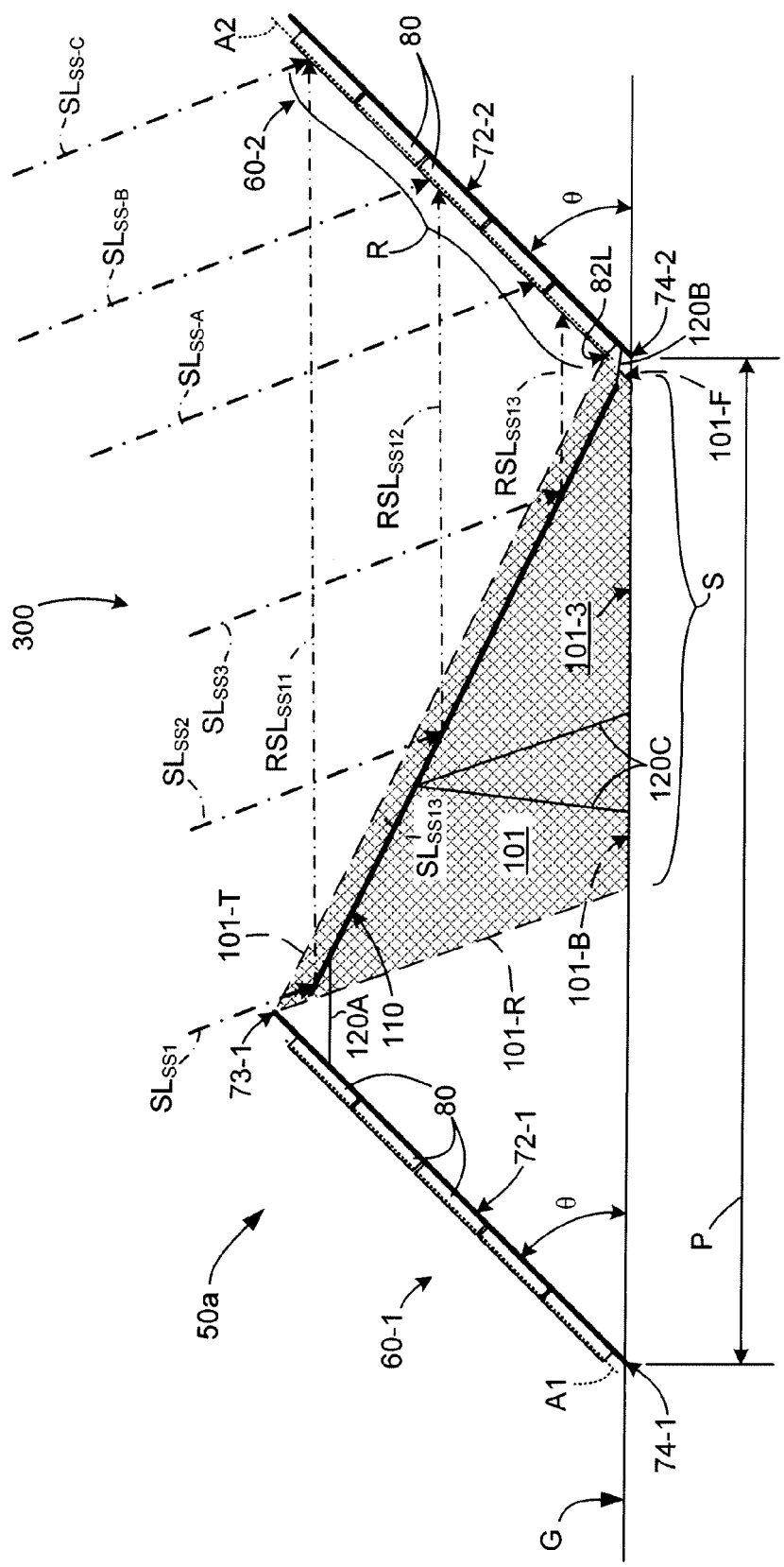
FIG. 12 is a simplified side elevation view showing a modified PV-farm-type stationary sunlight redirecting system utilizing a stationary sunlight redirecting element according to another embodiment of the present invention.
Figure 13A:
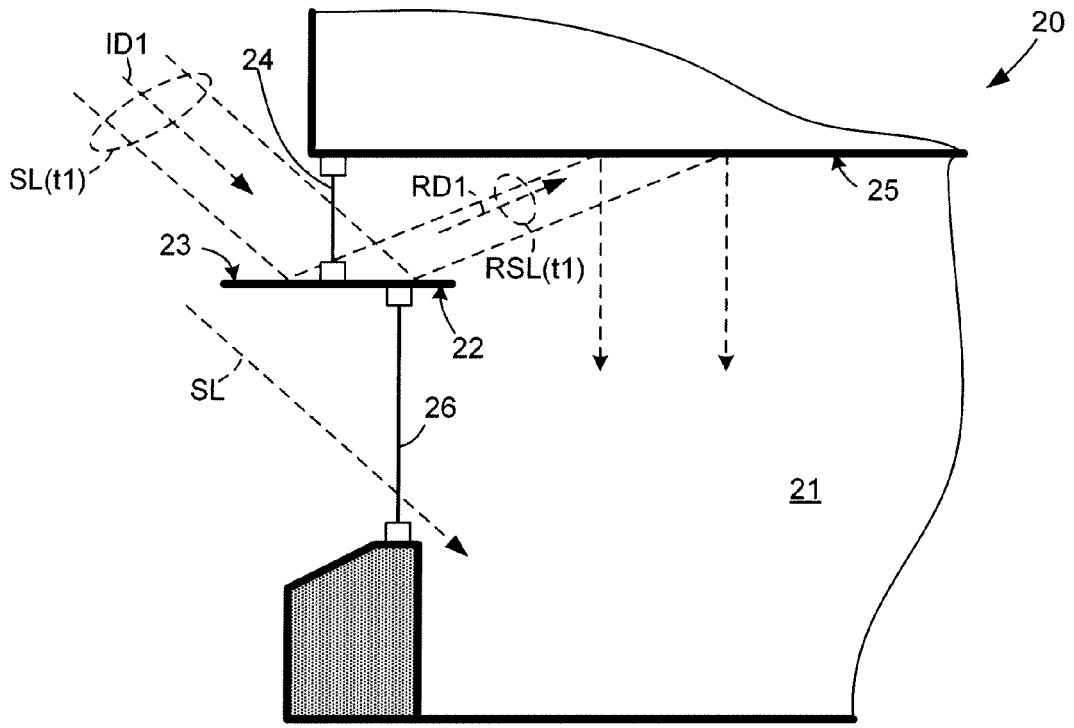
FIGS. 13(A) and 13(B) are simplified side elevation views showing a conventional architectural lighting arrangement.
Figure 13B:
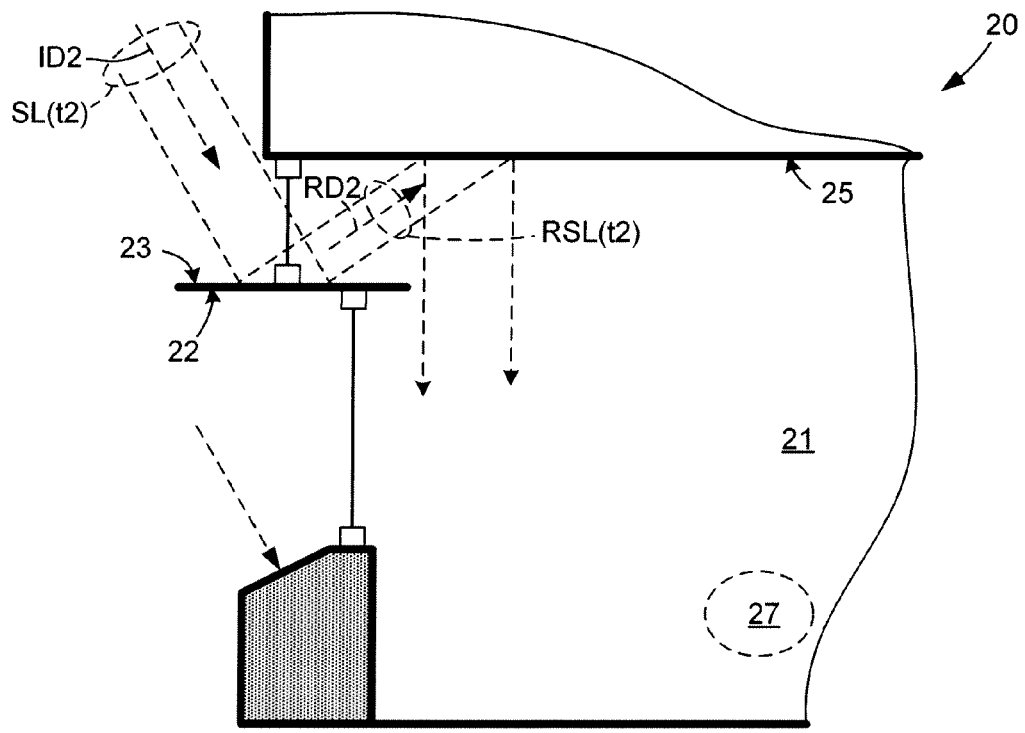
Figure 14:
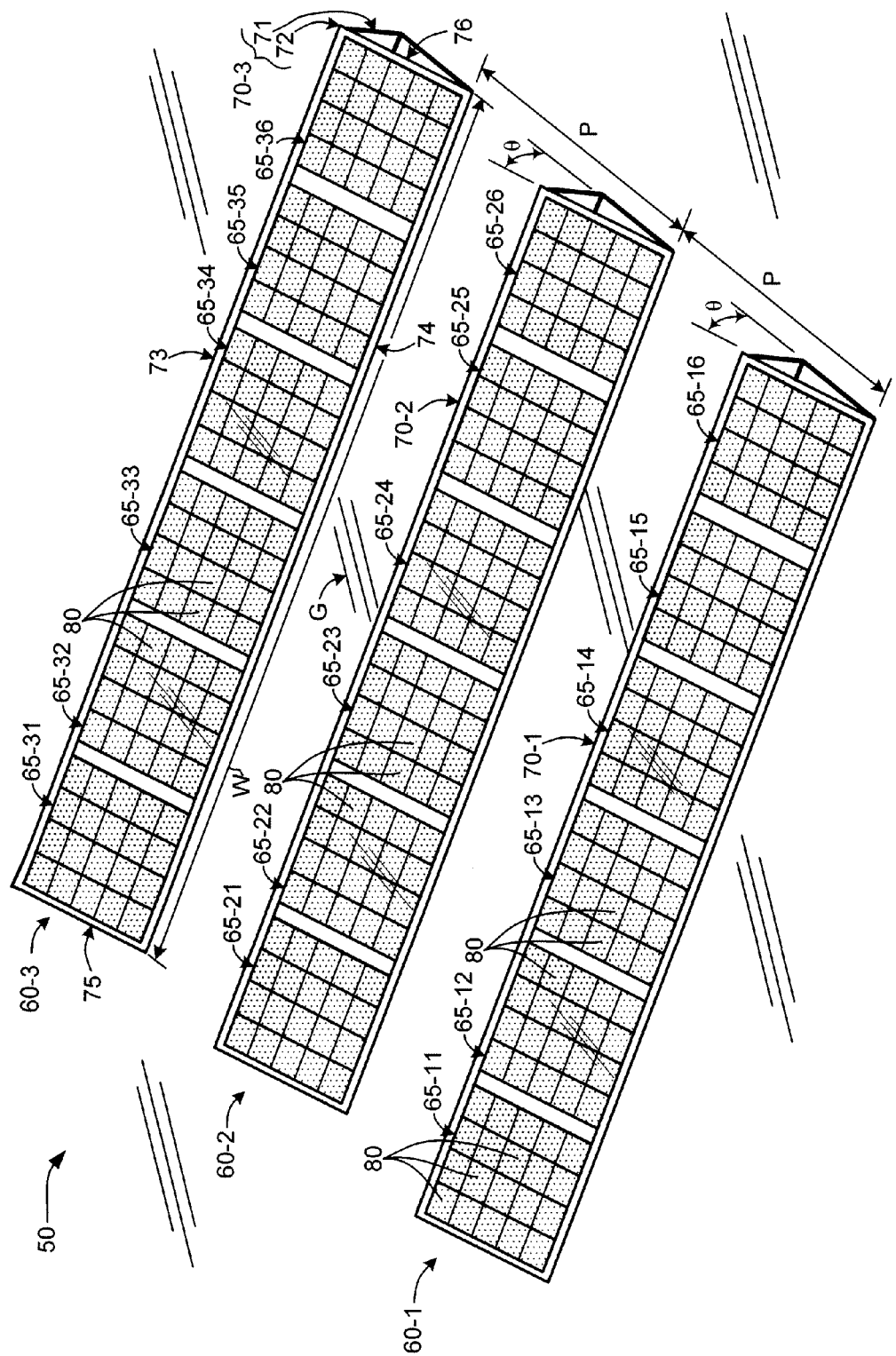
FIG. 14 is a simplified top front perspective view showing a conventional fixed-tilt PV farm.
Figure 15:
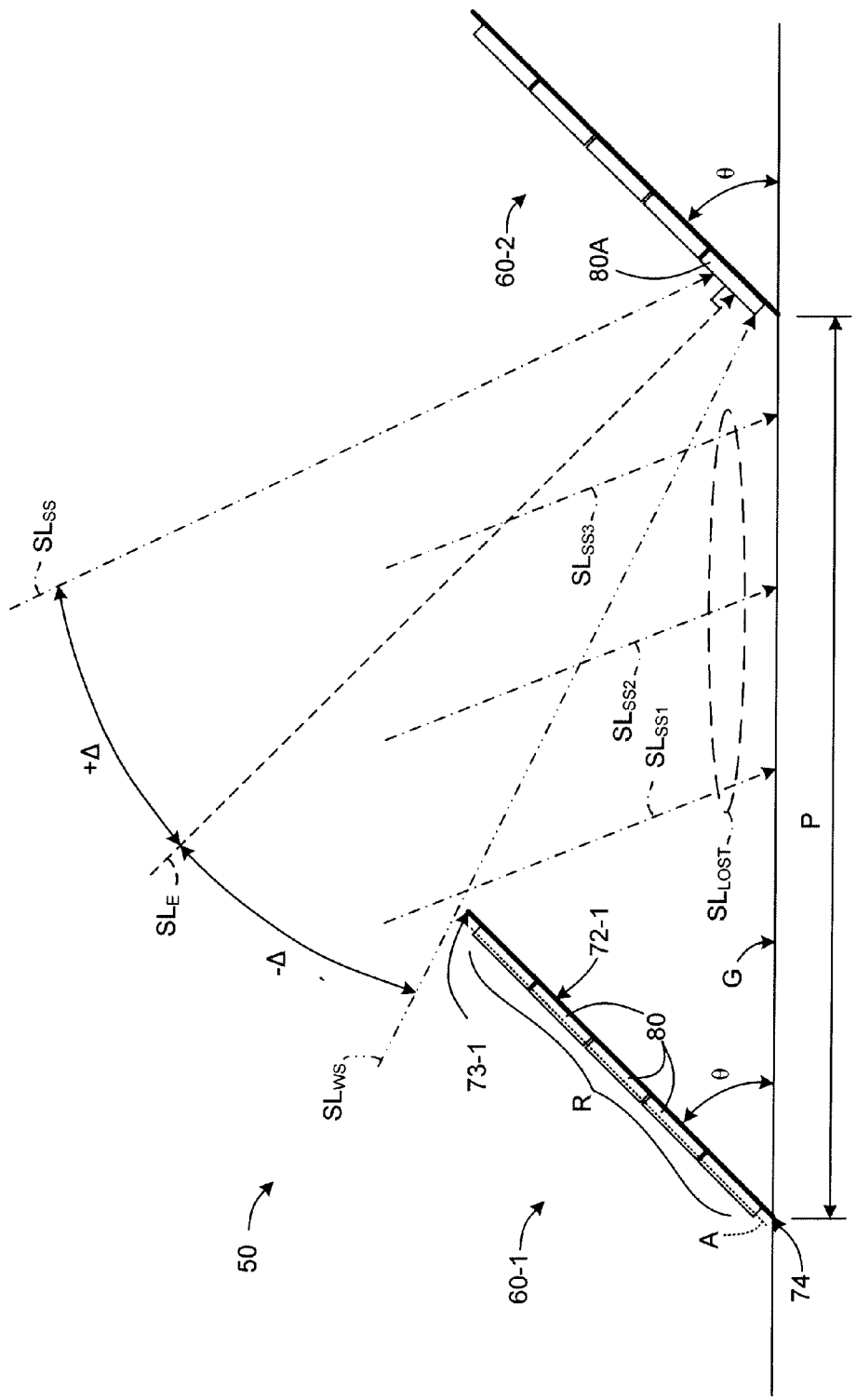
FIG. 15 is a simplified side elevation view showing a portion of the PV farm of FIG. 14.

FIG. 12 shows a second stationary sunlight redirecting system 300 implemented as a portion of a flat panel, fixed-tilt PV farm 50a in which a sunlight redirecting element 110 is maintained in a fixed relationship to a solar panel 60-2 by any of brackets 120A, 120B and 120C. Sunlight redirecting element 110 is implemented according to any of the embodiments described above.

Similar to conventional fixed-tilt PV farms, fixed-tilt PV farm 50a includes multiple PV panel assemblies that maintain flat-panel solar PV modules in an inclined angle relative to level ground in order to maximize the capture of sunlight. FIG. 12 shows two such PV panel assemblies 60-1 and 60-2, each including multiple flat panel solar cells 80 that are arranged in a substantially planar array and are maintained in a desired "fixed-tilt" arrangement by a corresponding support structure. For example, PV panel assembly 60-1 includes multiple solar cells 80 that are supported by a panel support structure 72-1 in a substantially planar array A1 between an upper horizontal edge 73-1 and a corresponding lower horizontal edge 74-1, wherein panel support structure 72-1 is maintained in an inclined angle θ relative to level ground G by an associated base or other support mechanism (not shown) substantially identical to that used in conventional arrangements. Similarly, PV panel assembly 60-2 includes multiple solar cells 80 that are maintained in a substantially planar array A2 and form an associated active surface R that is fixedly held at inclined angle θ relative to level ground G by a panel support structure 72-2. As indicated at the right side of FIG. 12, inclined angle θ is selected such that sunlight beams $SL_{SS-A}$, $SL_{SS-B}$ and $SL_{SS-C}$, which are generated, for example, at the time of a summer solstice, are directly received by active (target) surface R solar cells 80 disposed on PV panel assembly 60-2. Typical values for inclined (tilt) angle θ are in the range of 0.7 to 1.0 times the latitude at which PV farm 50a is installed.

Also similar to conventional fixed-tilt PV farms, the predetermined pitch (spacing) P between adjacent PV panel assemblies 60-1 and 60-2 of PV farm 50a is selected according to the latitude of installation and selected inclined angle θ to optimize the total amount of sunlight intercepted during each year by solar cells 80. That is, pitch P is set such that solar cells 80 of PV panel assembly 60-2 are not shaded by PV panel assembly 60-1 during the winter solstice of each year. As indicated in FIG. 12, this arrangement produces an offset space S separating adjacent PV panel assemblies 60-1 and 60-2 such that, e.g., at the time of summer solstice, sunlight beams $SL_{SS1}$, $SL_{SS2}$ and $SL_{SS3}$ are directed into offset space S. As described in further detail below, in the absence of redirecting element 110, sunlight beams $SL_{SS1}$, $SL_{SS2}$ and $SL_{SS3}$ are otherwise "wasted" because they strike the ground between solar cells 80 of adjacent PV panel assemblies 60-1 and 60-2, and are therefore not converted to electricity. The arrangement of FIG. 12 is most effectively utilized at latitudes in the range of 23 and 67 degrees (north or south), where relatively large required offset spacing S between adjacent fixed-tilt panel assemblies 60-1 and 60-2 provides significant otherwise "wasted" sunlight during the summer months.

According to an aspect of the present embodiment, sunlight redirecting element 110 is fixedly secured in offset space S between adjacent PV panel assemblies 60-1 and 60-2, where redirecting element 110 redirects at least a portion of the otherwise "wasted" sunlight onto PV panel assembly 60-2 in a substantially homogenous pattern (i.e., such that all solar cells 80 receive substantially the same amount of redirected sunlight). By redirecting at least a portion of the otherwise "wasted" sunlight entering offset space S during at least a portion of the year (e.g., at least in summer), sunlight redirecting element 110 serves to increase the efficiency of fixed-tilt, flat panel PV farm 50a on an annual basis by 5 to 10% or more.

According to another aspect of the present embodiment, redirecting element 110 is located in a prismatic "design space" volume 101 defined at its upper end by an inclined upper plane 101-T that extends across offset space S separating adjacent PV panel assemblies 60-1 and 60-2 (i.e., a plane extending between upper edge 73-1 of PV panel assembly 60-1 and a lower edge 74-2 of PV panel assembly 60-2). By positioning redirecting element 110 below inclined upper plane 101-T, undesirable shading of PV panel assembly 60-2 during winter months, when the incident sunlight is received at a shallow angle, is prevented. In one embodiment prismatic volume 101 is further bounded by a front plane 101-F, a rear plane 101-R, and the ground surface disposed between PV panel assemblies 60-1 and 60-2. Front plane 101-F extends between ground G and a lower edge 82L of the solar cells 80 mounted on PV panel assembly 60-2, and is inclined at an angle defined by plane A2. Positioning redirecting element 110 behind front plane 101-F facilitates redirection of sunlight onto active region R of PV panel assembly 60-2 at an effective angle. Rear plane 101-R extends between ground G and upper edge 73-1 of PV panel assembly 60-1, and is inclined at an angle defined by the expected sunlight direction at noon on the summer solstice. Locating redirecting element 110 in front of rear plane 101-R facilitates directing sunlight onto the (i.e., locating element 110 behind rear plane 101-R would prevent element 110 from receiving direct sunlight, even in summer). In one specific embodiment, redirecting element 110 is positioned within an associated prismatic volume 101 such that the redirecting element 110 receives and redirects sunlight during 70% of the year.

According to yet another aspect of the present embodiment, redirecting element 110 remains fixed relative to target PV panel assembly 60-2 at all times by way of a bracket or other securing mechanism. For example, as indicated in simplified form in FIG. 12 and discussed in further detail below, such securing mechanisms include at lease one of a bracket 120A that secures redirecting element 110 to an upper portion of PV panel assembly 60-1, a bracket 120B that secures redirecting element 110 to a lower portion of PV panel assembly 60-2, and a platform 120C that supports redirecting element 110 on ground G between PV panel assemblies 60-1 and 60-2. By providing such a securing mechanism, redirecting element 110 is reliably and optimally positioned and oriented such that parallel sunlight directed into offset space S is redirected by redirecting structures 112 toward the active region R of target PV panel assembly 60-2.

Although the present invention has been described with respect to certain specific embodiments, it will be clear to those skilled in the art that the inventive features of the present invention are applicable to other embodiments as well, all of which are intended to fall within the scope of the present invention. For example, although the sunlight redirecting elements of the present invention have been described above with reference to several specific embodiments, the disclosed embodiments are intended to be exemplary and not limiting, and those skilled in the art will recognize that other existing or yet-to-be invented film generating technologies may be utilized to produce reflective/refractive/scattering surfaces that perform the sunlight redirecting function described herein. Further, the alternative specific embodiments set forth above, e.g., with reference to FIGS. 3-6, illustrate a property that is typically available when designing optical systems: i.e., the inventive notion of a design based on refractive optics can be readily transferred into a design based on (e.g.) reflective optics by one skilled in the art, and vice versa. The underlying inventive concept is preserved, while manufacturing ease or some loss modes may vary. Going even further, those designers specializing for example on diffractive optics may often be able to recognized the principle of, for example, a refractive design, and translate it into a design based on diffractive or holographic optics without deviating from the inventive principle. Such translation is particularly straightforward for the optical elements presented here, since the significant tolerance margins are available, chromatic effects are tolerable to a large degree and no imaging requirements are present. As such, unless specifically limited to specific structures associated with the specific embodiments set forth above, the appended claims are not intended to be limited to the specific embodiments disclosed herein.

The invention claimed is:

1. A sunlight redirecting element for redirecting sunlight onto a predetermined target surface, the sunlight redirecting element comprising:
  a base; and
  a plurality of substantially identical redirecting structures uniformly arranged and fixedly disposed on the base, each redirecting structure including a plurality of corresponding optical surface regions,
  wherein said plurality of corresponding optical surface regions of each said redirecting structure are cooperatively formed and arranged such that, when said sunlight redirecting element is operably fixedly oriented relative to the target surface with said sunlight directed along an incident direction onto the plurality of redirecting structures, at least some of said sunlight is transmitted between the plurality of corresponding optical surface regions of each said redirecting structure, and redirected from the plurality of corresponding optical surface regions toward said target surface,
  wherein the base of said sunlight redirecting element comprises a transparent material layer having an upper surface and an opposing lower surface, and
  wherein said sunlight redirecting element comprises at least one reflective surface region disposed on the lower surface of the transparent material layer and arranged such that said sunlight directed along the incident direction onto an associated region of the upper surface is refracted onto said at least one reflective surface region, and sunlight that is reflected by the at least one reflective surface region is directed through the upper surface to the target surface.

2. The sunlight redirecting element of claim 1, wherein said plurality of corresponding optical surface regions of each redirecting structure are cooperatively formed and arranged such that said sunlight is successively redirected by the plurality of corresponding optical surface regions of each redirecting structure substantially along a substantially fixed second direction when the incident direction changes over time from a first incident direction to a second incident direction.

3. The sunlight redirecting element of claim 1, wherein said base comprises a planar substrate, and said plurality of substantially identical redirecting structures are oriented identically and disposed on the planar substrate such that said redirected sunlight is directed along substantially parallel nominal paths toward said target surface.

4. The sunlight redirecting element of claim 1, wherein said a base comprises a curved substrate and said plurality of substantially identical redirecting structures are oriented identically and disposed on the curved substrate such that said sunlight redirected by a first redirecting structure disposed on a first region of the curved substrate is transmitted along an associated first nominal direction toward said target surface, and said sunlight redirected by a second redirecting structure disposed on a second region of the curved substrate is transmitted along an associated second nominal direction toward said target, where the first and second nominal directions are non-parallel.

5. The sunlight redirecting element of claim 1, wherein said base defines a planar substrate and said plurality of substantially identical redirecting structures are oriented and disposed on the planar substrate such that said sunlight redirected by a first redirecting structure disposed on a first region of the plane is transmitted along an associated first nominal direction toward said target surface, and said sunlight redirected by a second redirecting structure disposed on a second region of the plane is transmitted along an associated second nominal direction toward said target, where the first and second nominal directions are non-parallel.

6. The sunlight redirecting element of claim 1, wherein each of the plurality of corresponding optical surface regions of each redirecting structure comprises said at least one light reflecting surface, and at least one of a light refracting surface, a light scattering surface, a light diffractive surface, a holographic optical surface, a surface bordering a volume with gradient index, a surface capable of exhibiting total internal reflection, a surface bordering a volume hologram, a luminescent surface, a surface bordering a luminescent volume, a surface enhanced by plasmonically active features or hybrids of the above.

7. The sunlight redirecting element of claim 1, wherein each of said plurality of redirecting structure comprises a first curved optical surface region and a corresponding second curved optical surface region arranged such that sunlight directed onto the first curved optical surface region is redirected onto the corresponding second curved optical surface region.

8. The sunlight redirecting element of claim 7, wherein said first and second curved optical surface regions of each of said redirecting structure comprise a first curved reflective surface region and a second curved reflective surface region arranged such that sunlight directed onto the first curved reflective surface region is reflected by said first curved reflective surface region directly onto the second curved reflective surface region.

9. The sunlight redirecting element of claim 7,
wherein said sunlight redirecting element further comprises a transparent material layer having an upper surface, and
wherein said first curved optical surface region and said corresponding second curved optical surface region of each said sunlight redirecting element comprise respective first and second elongated parabolic cylindrical sections of the upper surface of the transparent material layer.

10. The sunlight redirecting element of claim 9,
wherein the sunlight redirecting element further comprises a planar reflective surface disposed on a lower surface of the transparent material layer, and
wherein said first curved optical surface region and said second curved optical surface region are arranged such that said sunlight directed along the incident direction is refracted by the first curved optical surface region onto the planar reflective surface such that the sunlight is reflected by said planar reflective surface and focused on a section of said corresponding second curved optical surface region.

11. The sunlight redirecting element of claim 10,
wherein the first and second curved optical surface regions of each said plurality of redirecting structures are arranged such that first sunlight directed along a first incident direction is focused by the first curved optical surface region onto a first corresponding region of the corresponding second curved optical surface regions, and second sunlight directed along a second incident direction is focused by the first curved optical surface region onto a second corresponding region of the corresponding second curved optical surface region, and
wherein said first and second sunlight that is refracted by the corresponding second curved optical surface region such that the redirected first and second sunlight is transmitted to the target surface along a common second direction.

12. The sunlight redirecting element of claim 1,
wherein said plurality of corresponding optical surface regions comprise a plurality of planar optical surface regions arranged in a sawtooth pattern,
wherein each redirecting structure includes a first planar reflective surface region of said plurality of planar optical surface regions and a second planar scattering surface region of said plurality of planar optical surface regions, and
wherein said each redirecting structure is arranged such that sunlight directed onto the first planar reflective surface region is reflected onto the corresponding second planar scattering surface region.

13. The sunlight redirecting element of claim 12,
wherein the base of said sunlight redirecting element comprises a transparent material layer having a planar upper surface and an opposing lower surface including a plurality of elongated planar surface sections arranged in said sawtooth pattern,
wherein the first planar reflective surface region and the corresponding second planar scattering surface region of each said redirecting structure comprise associated materials disposed on associated first and second elongated planar surface sections of the lower surface of the transparent material layer and are arranged such that said sunlight directed along the incident direction onto associated first region of the planar upper surface is refracted onto said first planar reflective surface region, and sunlight that is scatter by the corresponding second planar scattering surface region is directed through the planar surface to the target surface.

14. The sunlight redirecting element of claim 13, wherein the first planar reflective surface region of each said redirecting structure comprises a light reflecting material disposed on the first elongated planar surface section of the lower surface of the transparent material layer, and the corresponding second planar scattering surface region of each said redirecting structure comprises a light scattering material disposed on the second elongated planar surface section of the lower surface of the transparent material layer.

15. The sunlight redirecting element of claim 13,
wherein said associated first and second elongated planar surface sections associated with each said redirecting structure forms a V-shaped groove, and
wherein each said redirecting structure further comprises a second reflective surface region formed on the second elongated planar surface section between said second planar scattering surface region and said V-shaped groove.

16. A sunlight redirecting element for redirecting sunlight onto a predetermined target surface, the sunlight redirecting element comprising:
a base; and
a plurality of substantially identical redirecting structures uniformly arranged and fixedly disposed on the base, each redirecting structure including a plurality of corresponding optical surface regions,
wherein said plurality of corresponding optical surface regions of each said redirecting structure are cooperatively formed and arranged such that, when said sunlight redirecting element is operably fixedly oriented relative to the target surface with said sunlight directed along an incident direction onto the plurality of redirecting structures, at least some of said sunlight is transmitted between the plurality of corresponding optical surface regions of each said redirecting structure, and redirected from the plurality of corresponding optical surface regions toward said target surface,
wherein each of said plurality of redirecting structure comprises a first curved optical surface region and a corresponding second curved optical surface region arranged such that sunlight directed onto the first curved optical surface region is redirected onto the corresponding second curved optical surface region,
wherein said first and second curved optical surface regions of each of said redirecting structure comprise a first curved reflective surface region and a second curved reflective surface region arranged such that sunlight directed onto the first curved reflective surface region is reflected by said first curved reflective surface region directly onto the second curved reflective surface region, wherein the base of said sunlight redirecting element comprises a transparent material layer having a planar upper surface and an opposing lower surface, and wherein the corresponding first and second curved reflective surface regions of each said plurality of redirecting structures are disposed on the lower surface of the transparent material layer and are arranged such that said sunlight directed along the incident direction onto an associated first region of the planar upper surface is refracted onto said first curved reflective surface region, and sunlight that is reflected by the corresponding second curved reflective surface region is directed through the planar surface to the target surface.

17. The sunlight redirecting element of claim 16, wherein the first and second curved reflective surface regions of each said plurality of redirecting structures are arranged such that first sunlight directed along a first incident direction is focused by the first curved reflective surface region onto a first corresponding region of the corresponding second curved reflective surface regions, and second sunlight directed along a second incident direction is focused by the first curved reflective surface region onto a second corresponding region of the corresponding second curved reflective surface regions, and wherein said first and second sunlight that is reflected by the corresponding second curved reflective surface region is refracted by the planar surface such that the redirected first and second sunlight is transmitted to the target surface along a common second direction.

18. The sunlight redirecting element of claim 16, wherein the first and second curved reflective surface regions of each said plurality of redirecting structures comprises mirror material layer portions deposited on corresponding curved sections of the lower surface of the transparent material layer.

19. A stationary sunlight redirecting system for redirecting sunlight onto a target surface of a stationary target, the system comprising:

a sunlight redirecting element including:
- a base that is fixedly supported relative to the stationary target; and
- a plurality of substantially identical redirecting structures uniformly arranged and fixedly disposed on the base, each redirecting structure including a plurality of corresponding optical surface regions; and means for maintaining the sunlight redirecting element in an operable fixed position relative to the stationary target such that, when said sunlight is directed along an incident direction onto the plurality of redirecting structures, at least some of the sunlight is transmitted between the plurality of corresponding optical surface regions of each said redirecting structure, and redirected from the plurality of corresponding optical surface regions toward said target surface, wherein the base of said sunlight redirecting element comprises a transparent material layer having an upper surface and an opposing lower surface, and wherein said sunlight redirecting element comprises at least one reflective surface region disposed on the lower surface of the transparent material layer and arranged such that said sunlight directed along the incident direction onto an associated region of the upper surface is refracted onto said at least one reflective surface region, and sunlight that is reflected by the at least one reflective surface region is directed through the upper surface to the target surface.

20. An architectural daylighting system for directing sunlight into a room disposed on the outer wall of a building, the room having a ceiling surface, the architectural daylighting system comprising:

a light shelf disposed along the outer wall and having a upper surface disposed under a window; and a sunlight redirecting element fixedly disposed on the upper surface of the light shelf, the sunlight redirecting element including:
- a base; and
- a plurality of substantially identical redirecting structures uniformly arranged and fixedly disposed on the base, each redirecting structure including a plurality of corresponding optical surface regions, wherein said plurality of corresponding optical surface regions of each said redirecting structure are cooperatively formed and arranged such that, when said sunlight is directed along an incident direction onto the plurality of redirecting structures, at least some of said sunlight is transmitted between the plurality of corresponding optical surface regions of each said redirecting structure, and is redirected from the plurality of corresponding optical surface regions toward a target surface region of said ceiling surface, wherein the base of said sunlight redirecting element comprises a transparent material layer having an upper surface and an opposing lower surface, and wherein said sunlight redirecting element comprises at least one reflective surface region disposed on the lower surface of the transparent material layer and arranged such that said sunlight directed along the incident direction onto an associated region of the upper surface is refracted onto said at least one reflective surface region, and sunlight that is reflected by the at least one reflective surface region is directed through the upper surface to the target surface.

\* \* \* \* \*